United States Patent
Dai et al.

(10) Patent No.: US 11,190,215 B2
(45) Date of Patent: Nov. 30, 2021

(54) DATA TRANSMISSION METHOD, CHIP, TRANSCEIVER, AND COMPUTER READABLE STORAGE MEDIUM

(71) Applicant: HUAWEI TECHNOLOGIES CO., LTD., Guangdong (CN)

(72) Inventors: Shengchen Dai, Hangzhou (CN); Huazi Zhang, Hangzhou (CN); Rong Li, Hangzhou (CN); Gongzheng Zhang, Hangzhou (CN); Lingchen Huang, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/683,594

(22) Filed: Nov. 14, 2019

(65) Prior Publication Data

US 2020/0083910 A1 Mar. 12, 2020

Related U.S. Application Data

(63) Continuation of application No. PCT/CN2018/086796, filed on May 15, 2018.

(30) Foreign Application Priority Data

May 15, 2017 (CN) .......................... 201710339409.X

(51) Int. Cl.
*H03M 13/00* (2006.01)
*H03M 13/15* (2006.01)
(Continued)

(52) U.S. Cl.
CPC ......... *H03M 13/155* (2013.01); *H03M 13/09* (2013.01); *H03M 13/19* (2013.01); *H03M 13/616* (2013.01)

(58) Field of Classification Search
CPC .... H03M 13/155; H03M 13/09; H03M 13/19; H03M 13/616
See application file for complete search history.

(56) References Cited

U.S. PATENT DOCUMENTS

2015/0194987 A1  7/2015  Li et al.
2016/0241355 A1  8/2016  Mahdavifar et al.
(Continued)

FOREIGN PATENT DOCUMENTS

CN  101640584 A  2/2010
CN  103684477 A  3/2014
(Continued)

OTHER PUBLICATIONS

Zhou et al. Polarization Weight Family Methods for Polar Code Construction, May 2018. arXiv:1805.02813v.pages 1-5..*
(Continued)

*Primary Examiner* — Samir W Rizk
(74) *Attorney, Agent, or Firm* — Fish & Richardson P.C.

(57) ABSTRACT

The present disclosure relates to data transmission methods. One example method includes obtaining K information bits, determining to-be-encoded bits, where the to-be-encoded bits include (K+P) bits, the (K+P) bits include the K information bits and P check bits, the K information bits correspond to K polarization channels, the P check bits include T first-type check bits, all the T first-type check bits are PC bits, and reliability of a polarization channel corresponding to each of the T first-type check bits is greater than a minimum value of reliability of the K polarization channels, and performing polar coding on the to-be-encoded bits to obtain encoded bits, where the (K+P) bits are in a one-to-one correspondence with (K+P) rows in a generator
(Continued)

matrix of the encoded bits, a maximum row weight corresponding to the T first-type check bits is less than or equal to $W_2$.

20 Claims, 5 Drawing Sheets

(51) Int. Cl.
 *H03M 13/09* (2006.01)
 *H03M 13/19* (2006.01)

(56) References Cited

U.S. PATENT DOCUMENTS

| | | |
|---|---|---|
| 2016/0254876 A1 | 9/2016 | Shen et al. |
| 2016/0269050 A1 | 9/2016 | Shen et al. |
| 2018/0287640 A1* | 10/2018 | Lin .................. H03M 13/6502 |

FOREIGN PATENT DOCUMENTS

| | | |
|---|---|---|
| CN | 104918063 A | 9/2015 |
| CN | 105684316 A | 6/2016 |
| CN | 106100794 A | 11/2016 |

OTHER PUBLICATIONS

3GPP TS 36.212 V14.2.0 (Mar. 2017), "3rd Generation Partnership Project; Technical Specification Group Radio Access Network; Evolved Universal Terrestrial Radio Access (E-UTRA); Multiplexing and channel coding (Release 14)," Mar. 2017, 197 pages.

PCT International Search Report and Written Opinion issued in International Application No. PCT/CN2018/086796 dated Jul. 31, 2018, 22 pages (with English translation).

Office Action issued in Chinese Application No. 201710339409.X dated Nov. 25, 2019, 10 pages (with English translation).

Extended European Search Report issued in European Application No. 18802674.4 dated Apr. 22, 2020, 12 pages.

Huawei et al., "Polar code design," 3GPP TSG RAN WG1 Meeting #89, R1-1706965; Hangzhou, China, XP051272195, May 15-19, 2017 12 pages.

Huawei et al., "Polar Code Construction for NR," 3GPP TSG RAN WG1 Meeting #86bis, R1-1608862; Lisbon, Portugal, XP051148916, Oct. 10-14, 2016, 8 pages.

Huawei et al., "Summary of polar code design for control channels," 3GPP TSG RAN WG1 Ad-Hoc Meeting, R1-1700088; Spokane, USA, XP051207630, Jan. 16-20, 2017, 10 pages.

\* cited by examiner

DATA TRANSMISSION METHOD, CHIP, TRANSCEIVER, AND COMPUTER READABLE STORAGE MEDIUM

CROSS REFERENCE TO RELATED APPLICATIONS

This application is a continuation of International Application No. PCT/CN2018/086796, filed on May 15, 2018, which claims priority to Chinese Patent Application No. 201710339409.X, filed on May 15, 2017. The disclosures of the aforementioned applications are hereby incorporated by reference in their entireties.

TECHNICAL FIELD

This application relates to the wireless communications field, and more specifically, to a data transmission method, a chip, a transceiver, and a computer readable storage medium.

BACKGROUND

Through use of a polar code (polar code), an information transmission rate of a channel can theoretically reach a Shannon channel capacity. In addition, a polar code encoding/decoding algorithm is simple and easy to implement. Therefore, polar coding attracts increasing attention as a new channel coding scheme.

Polar coding may be represented by $x = u \cdot F_n$, where $u$ represents a binary vector of a length n, and $F_n$ is a Kronecker (Kronecker) transformation matrix. $F_n$ may also be referred to as a polar code generator matrix.

$$F_n = \begin{bmatrix} 1 & 0 \\ 1 & 1 \end{bmatrix}^{\otimes n}$$

is a Kronecker product of a 2×2 matrix $$\begin{bmatrix} 1 & 0 \\ 1 & 1 \end{bmatrix}.$$

After a receive end decodes, by using a successive cancellation (successive cancellation, SC) algorithm, encoded bits generated in the polar coding scheme, a polarization phenomenon occurs, so that some bits in u are transmitted by using an equivalent high-reliability channel, and are decoded at a high probability, and remaining bits in u are transmitted by using an equivalent low-reliability channel, and are decoded at a low probability. The equivalent high-reliability channel and the equivalent low-reliability channel are polar code polarization channels.

The polarization phenomenon of polar coding can be fully used to improve information transmission reliability. For example, an information bit may be placed, for polar coding and transmission, at a bit location corresponding to a polarization channel with relatively high reliability, so that transmission reliability of the information bit is relatively high. At a bit location corresponding to a polarization channel with relatively low reliability, no valid data may be transmitted, and only some bits whose value is 0 (the bits may be referred to as frozen bits) are transmitted.

FIG. 1 is used as an example for description. A code length N of a polar code in FIG. 1 is 8, and corresponds to eight polarization channels. Reliability of the eight polarization channels may be pre-calculated. It is found through calculation that reliability of polarization channels corresponding to bit locations $u_4$, $u_6$, $u_7$, and $u_8$ is far higher than reliability of polarization channels corresponding to bit locations $u_1$, $u_2$, $u_3$, and $u_5$. Therefore, the bit locations $u_4$, $u_6$, $u_7$, and $u_8$ may be set as information bit locations, and the bit locations $u_1$, $u_2$, $u_3$, and $u_5$ may be set as frozen bit locations. In this way, 4 information bits may be encoded into 8 encoded bits. Then subsequent processing such as modulation may be performed on the encoded bits, and data obtained after the processing is transmitted to a receive end through a noise channel.

To enhance polar code encoding/decoding performance, check information is added to a conventional polar code in the related prior art to obtain an improved polar code. Common polar codes including check information include a cyclic redundancy check (cyclic redundancy check, CRC) polar code, a parity check (parity check, PC) polar code, and the like.

However, a bit location of a check bit in the check information in the polar code is not specified in the related prior art. If the bit location of the check bit in the polar code is inappropriate, polar code encoding/decoding performance may be degraded.

SUMMARY

This application provides a data transmission method, a chip, a transceiver, and a computer readable storage medium, to enhance polar code encoding/decoding performance.

According to a first aspect, a data transmission method is provided. The method includes: obtaining K information bits, where K is a positive integer not less than 1; determining to-be-encoded bits, where the to-be-encoded bits include (K+P) bits, the (K+P) bits include the K information bits and P check bits, the K information bits correspond to K polarization channels, the P check bits include T first-type check bits, all the T first-type check bits are parity check PC bits, reliability of a polarization channel corresponding to each of the T first-type check bits is greater than a minimum value of reliability of the K polarization channels, both P and T are nonnegative integers, and T≤P; performing polar coding on the to-be-encoded bits to obtain encoded bits, where the (K+P) bits are in a one-to-one correspondence with (K+P) rows in a generator matrix of the encoded bits, a minimum row weight of the (K+P) rows is $W_1$, a maximum row weight corresponding to the T first-type check bits is less than or equal to $W_2$, $W_2$ represents a minimum value other than $W_1$ in row weights of the (K+P) rows, and both $W_1$ and $W_2$ are positive integers not less than 1; and transmitting the encoded bits to a receive end.

According to a second aspect, a data transmission method is provided. The method includes: receiving encoded bits transmitted by a transmit end; performing polar decoding on the encoded bits to obtain decoded bits, where the decoded bits include (K+P) bits, the (K+P) bits include K information bits and P check bits, the K information bits correspond to K polarization channels, the P check bits include T first-type check bits, all the T first-type check bits are parity check PC bits, reliability of a polarization channel corresponding to each of the T first-type check bits is greater than a minimum value of reliability of the K polarization channels, the (K+P) bits are in a one-to-one correspondence with (K+P) rows in a generator matrix of the encoded bits, a minimum row weight of the (K+P) rows is $W_1$, a maximum row weight corresponding to the T first-type check bits is less than or equal to $W_2$, $W_2$ represents a minimum value other than $W_1$ in row weights of the (K+P) rows, both $W_1$ and $W_2$ are positive integers not less than 1, both P and T are nonnegative integers, T≤P, and all of K, $W_1$, and $W_2$ are positive integers not less than 1; and checking at least some of the K information bits by using the P check bits.

According to a third aspect, a data transmission apparatus is provided. The data transmission apparatus may be, for example, a transmitter, the transmitter may be a terminal device or a base station, and the data transmission apparatus includes a module configured to perform the method in the first aspect.

According to a fourth aspect, a data transmission apparatus is provided. The data transmission apparatus may be, for example, a receiver, the receiver may be a terminal device or a base station, and the data transmission apparatus includes a module configured to perform the method in the second aspect.

According to a fifth aspect, a chip is provided. The chip includes: a memory, configured to store a program; and a processor, configured to execute the program stored in the memory, to perform the following operations: obtaining K information bits, where K is a positive integer not less than 1; determining to-be-encoded bits, where the to-be-encoded bits include (K+P) bits, the (K+P) bits include the K information bits and P check bits, the K information bits correspond to K polarization channels, the P check bits include T first-type check bits, all the T first-type check bits are parity check PC bits, reliability of a polarization channel corresponding to each of the T first-type check bits is greater than a minimum value of reliability of the K polarization channels, both P and T are nonnegative integers, and T≤P; and performing polar coding on the to-be-encoded bits to obtain encoded bits, where the (K+P) bits are in a one-to-one correspondence with (K+P) rows in a generator matrix of the encoded bits, a minimum row weight of the (K+P) rows is $W_1$, a maximum row weight corresponding to the T first-type check bits is less than or equal to $W_2$, $W_2$ represents a minimum value other than $W_1$ in row weights of the (K+P) rows, and both $W_1$ and $W_2$ are positive integers not less than 1.

According to a sixth aspect, a chip is provided. The chip includes: a memory, configured to store a program; and a processor, configured to execute the program stored in the memory, to perform the following operations: performing polar decoding on encoded bits received from a transmit end, to obtain decoded bits, where the decoded bits include (K+P) bits, the (K+P) bits include K information bits and P check bits, the K information bits correspond to K polarization channels, the P check bits include T first-type check bits, all the T first-type check bits are parity check PC bits, reliability of a polarization channel corresponding to each of the T first-type check bits is greater than a minimum value of reliability of the K polarization channels, the (K+P) bits are in a one-to-one correspondence with (K+P) rows in a generator matrix of the encoded bits, a minimum row weight of the (K+P) rows is $W_1$, a maximum row weight corresponding to the T first-type check bits is less than or equal to $W_2$, $W_2$ represents a minimum value other than $W_1$ in row weights of the (K+P) rows, both $W_1$ and $W_2$ are positive integers not less than 1, both P and T are nonnegative integers, T≤P, and all of K, $W_1$, and $W_2$ are positive integers not less than 1, and checking at least some of the K information bits by using the P check bits.

According to a seventh aspect, a transmitter is provided. The transmitter includes the chip in the fifth aspect, and the transmitter further includes a sending device, configured to transmit the encoded bits to a receive end. The transmitter may be a terminal device, or may be a base station.

According to an eighth aspect, a receiver is provided. The receiver includes the chip in the sixth aspect, and the receiver further includes a receiving device, configured to receive encoded bits transmitted by a transmit end. The receiver may be a terminal device, or may be a base station.

According to a ninth aspect, a computer readable storage medium is provided. The computer readable storage medium stores an instruction, and when the instruction runs on a transmitter, the transmitter is enabled to perform the method in the first aspect.

According to a tenth aspect, a computer readable storage medium is provided. The computer readable storage medium stores an instruction, and when the instruction runs on a receiver, the receiver is enabled to perform the method in the second aspect.

According to an eleventh aspect, a computer program product including an instruction is provided. When the computer program product runs on a transmitter, the transmitter is enabled to perform the method in the first aspect.

According to a twelfth aspect, a computer program product including an instruction is provided. When the computer program product runs on a receiver, the receiver is enabled to perform the method in the second aspect.

Optionally, in some of the foregoing implementations, the (K+P) rows include t1 first target rows, a row weight of each of the t1 first target rows is $W_1$, the t1 first target rows are in a one-to-one correspondence with t1 polarization channels, the T first-type check bits include f1 first-type check bits, the f1 first-type check bits correspond to f1 polarization channels with highest reliability in the t1 polarization channels, both t1 and f1 are positive integers not less than 1, t1<(K+P), and f1≤P.

Optionally, in some of the foregoing implementations, the (K+P) rows include t2 second target rows, a row weight of each of the t2 second target rows is $W_2$, the t2 second target rows are in a one-to-one correspondence with t2 polarization channels, the T first-type check bits include f2 first-type check bits, the f2 first-type check bits correspond to f2 polarization channels with highest reliability in the t2 polarization channels, both t2 and f2 are positive integers not less than 1, t2<(K+P), and f2≤P.

Optionally, in some of the foregoing implementations, the P check bits include f3 second-type check bits, all the f3 second-type check bits are PC bits, reliability of polarization channels corresponding to the f3 second-type check bits is less than the reliability of the K polarization channels, f3 is a positive integer not less than 1, and f3≤P.

Optionally, in some of the foregoing implementations, the T first-type check bits correspond to T polarization channels, the polarization channels corresponding to the f3 second-type check bits are f3 polarization channels with highest reliability other than the K polarization channels and the T polarization channels in M polarization channels, the M polarization channels are remaining polarization channels other than polarization channels or a polarization channel corresponding to a puncturing operation and/or a shortening operation in polarization channels used for the polar coding or the polar decoding, and M is a positive integer not less than 1.

Optionally, in some of the foregoing implementations, the T first-type check bits correspond to T polarization channels, the polarization channels corresponding to the f3 second-type check bits are f3 polarization channels with highest polarization channel sequence numbers other than the K polarization channels and the T polarization channels in M polarization channels, the M polarization channels are remaining polarization channels other than polarization channels or a polarization channel corresponding to a puncturing operation and/or a shortening operation in polarization channels used for the polar coding or the polar decoding, and M is a positive integer not less than 1.

Optionally, in some of the foregoing implementations, a difference between a location sequence number of each PC bit in the P check bits in the to-be-encoded bits or the decoded bits and a location sequence number of each information bit in the to-be-encoded bits or the decoded bits that is checked by using each PC bit is an integer multiple of a preset prime number.

Optionally, in some of the foregoing implementations, each PC bit included in the P check bits and each information bit checked by using each PC bit meet the following conditions: if $g_i=g_j$, a Hamming weight of $g_k$ is greater than a Hamming weight of each of $g_i$ and $g_j$; and if $g_i \ne g_j$, a Hamming weight of $g_k$ is greater than a minimum value of Hamming weights of $g_i$ and $g_j$, where $g_i$ represents a row vector that is in the generator matrix and that corresponds to each PC bit, $g_j$ represents a row vector that is in the generator matrix and that corresponds to each information bit, $g_k$=mod $(g_i+g_j, 2)$, and mod(.) represents a modulo operation.

Optionally, in some of the foregoing implementations, all the P check bits are PC bits, or the P check bits include a PC bit and a CRC bit.

In the technical solutions provided in this application, the T first-type check bits are set at bit locations corresponding to relatively small row weights. Generally, a bit location corresponding to a relatively small row weight corresponds to a polarization channel with relatively low reliability. Therefore, the manner of setting a bit location of a check bit provided in this application can effectively prevent the check bit from occupying a polarization channel with relatively high reliability, thereby avoiding polar code encoding/decoding performance degradation caused by inappropriate setting of the check bit location.

DESCRIPTION OF EMBODIMENTS

Figure 1:
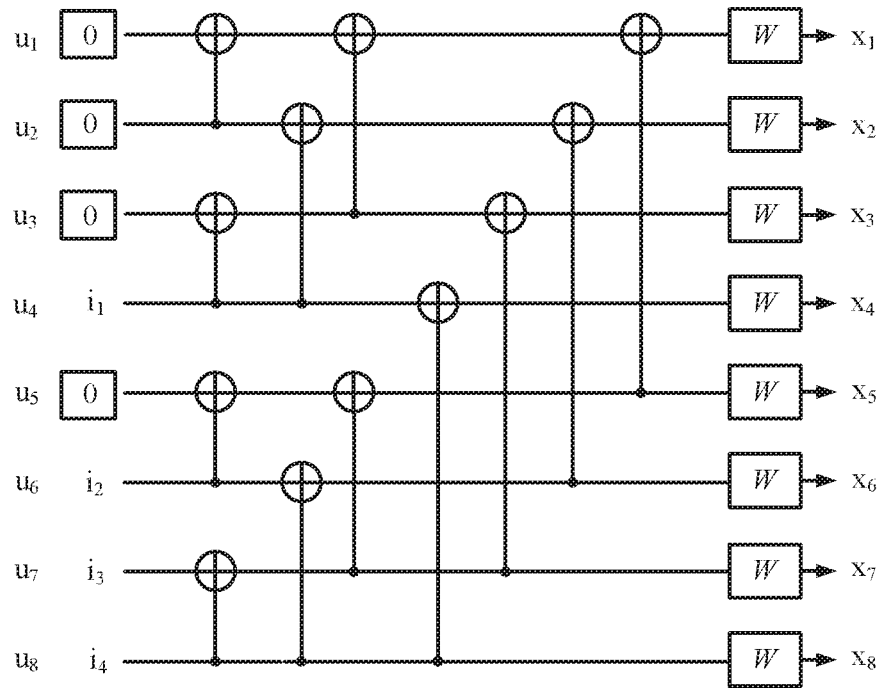
FIG. 1 is an example diagram of an encoding scheme of a polar code whose code length is 8.

For ease of understanding, a concept related to a polar code is first briefly described.

A polar code whose code length is N corresponds to a generator matrix, and the generator matrix is usually an N×N matrix. A row weight (or referred to as a Hamming height (hamming weight)) of each row in the generator matrix may be represented by a quantity of bits whose values are "1" in the row.

The polar code whose code length is N corresponds to N polarization channels, and the N polarization channels are in a one-to-one correspondence with N rows (or N row vectors) in the generator matrix. For a conventional polar code, polarization channels are classified into two types: a polarization channel corresponding to a frozen bit (or referred to as a frozen bit subchannel) and a polarization channel corresponding to an information bit (or referred to as an information bit subchannel). A minimum code distance of the conventional polar code is related to a row weight of a row that is in a generator matrix and that corresponds to an information bit. The following uses N=4 as an example for description.

It is assumed that a form of the generator matrix is as follows:

$$G = \begin{bmatrix} 1 & 0 & 0 & 0 \\ 1 & 1 & 0 & 0 \\ 1 & 0 & 1 & 0 \\ 1 & 1 & 1 & 1 \end{bmatrix}.$$

It can be learned from the foregoing formula that row weights of the first row to the fourth row in the generator matrix are respectively 1, 2, 2, and 4. It is assumed that a quantity K of information bits is 2, and polarization channels corresponding to the 2 information bits are a polarization channel 3 and a polarization channel 4. Because the polarization channel 3 corresponds to the third row in the generator matrix and the polarization channel 4 corresponds to the fourth row in the generator matrix, a minimum code distance of a polar code constructed based on the generator matrix is a minimum row weight in the row weights of the third row and the fourth row in the generator matrix. Therefore, the minimum code distance of the polar code is 2.

In a successive cancellation list (successive cancellation list, SCL) algorithm, a PC polar code has a desirable code distance and a lower block error rate (block error rate, BLER) than a conventional polar code and a CRC polar code (or referred to as a CRC assistant polar code). Therefore, the PC polar code has a relatively high application potential. For the PC polar code, check precoding is first performed on an information bit before polar coding. A check precoding process is briefly described as follows: An information bit checked by using each check bit is determined according to a preset check rule. The check rule describes an association relationship between a check bit and an information bit checked by using the check bit. For example, the check rule may be set as follows: A difference between a bit location sequence number of a check bit and a bit location sequence number of an information bit meets a specific condition. An information bit checked by using each check bit is determined once the check rule is determined. A check equation is formed by using the information bit and the check bit together. The last bit in members of the check equation is a check bit, and a value of the last bit is a modulo 2 sum of other members of the check equation. For example, if the check equation is [1 3 5 7], the first bit location, the third bit location, and the fifth bit location are information bit locations. If values of the information bit locations are respectively $u_1$, $u_3$, and $u_5$, a value $u_7$ of a check bit location is equal to $mod(u_1+u_3+u_5, 2)$.

Rate matching processing is usually performed on encoded bits obtained after polar coding. The following briefly describes a polar code rate matching manner.

In a channel coding document, usually, N is used to represent a length of an encoded vector (a vector formed by encoded bits), and K is used to represent a length of an information vector (a vector formed by information bits). In a communications system, limited by a system design, a length of a to-be-transmitted code may be set to any code length. Therefore, for a polar code, rate matching needs to be performed on an encoded vector to obtain a sending vector of any length, and the vector existing before the rate matching may be referred to as a mother code vector. For ease of description, in the following, a length of the mother code vector is denoted as N, and a length of the sending vector obtained after the rate matching is denoted as $N_0$. N is usually 2 raised to an integer power, and $N_0$ may be any positive integer.

There are a plurality of polar code rate matching manners, for example, at least one of the following rate matching manners: repetition (repetition), puncturing (puncture), and shortening (shorten). When $N<N_0$, rate matching is usually performed through repetition. Specifically, some or all bits in the mother code vector whose length is N may be repeated, and the mother code vector is not sent until the length of the vector reaches No. When $N_0>N$, rate matching is usually performed through puncturing and shortening. Specifically, some encoded bits in the mother code vector may be deleted (or not sent), so that the length of the vector is reduced to $N_0$ before sending.

To enhance polar code encoding/decoding performance, check information is added to a conventional polar code in a related technology to obtain an improved polar code. Common polar codes including check information include a CRC polar code, a PC polar code, and the like.

However, a bit location of the check information in the polar code is not specified in the related technology. If a bit location of a check bit in the polar code is inappropriate, polar code encoding/decoding performance may be degraded.

Figure 2:
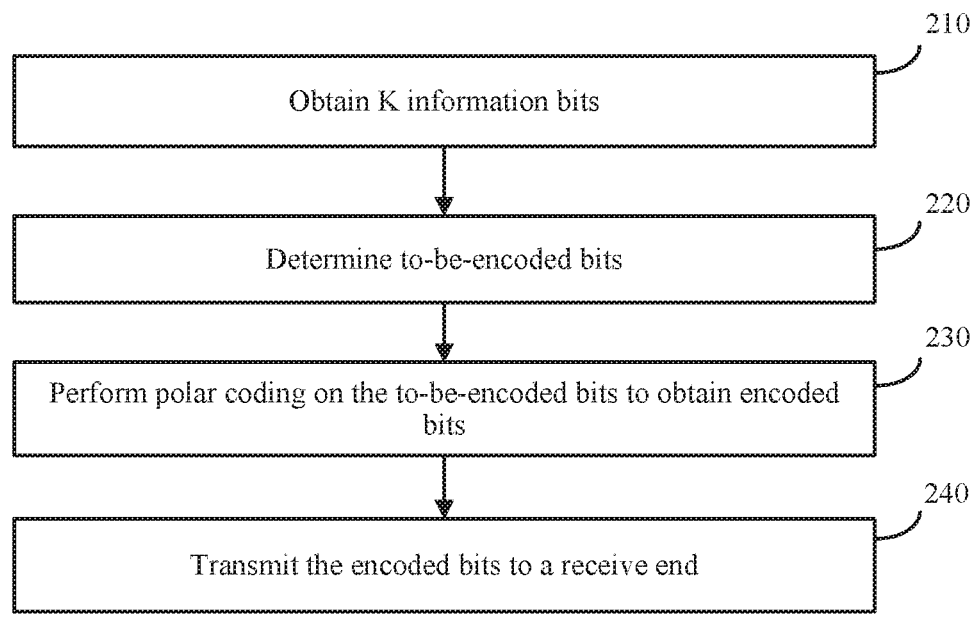
FIG. 2 is a schematic flowchart of a data transmission method according to an embodiment of this application.

The following describes the embodiments of this application with reference to FIG. 2.

FIG. 2 is a schematic flowchart of a data transmission method according to an embodiment of this application. The method in FIG. 2 includes the following steps.

210. Obtain K information bits, where K is a positive integer not less than 1.

A value of K is not specifically limited in this embodiment of this application, and may be any positive integer not less than 1. For example, the value of K may be any positive integer in 12 to 22. For another example, the value of K may be less than 12, or may be greater than 22.

It should be further understood that information content of the K information bits is not specifically limited in this embodiment of this application. For example, the information content of the K information bits may be control information (or signaling) in an uplink control channel and/or a downlink control channel in any wireless communications system. The wireless communications system may be, for example, a global system for mobile communications (global system for mobile communications, GSM), a code division multiple access (code division multiple access, CDMA) system, a wideband code division multiple access (wideband code division multiple access, WCDMA) system, a general packet radio service (general packet radio service, GPRS) system, a long term evolution (long term evolution, LTE) system, a long term evolution advanced (advanced long term evolution, LTE-A) system, a universal mobile telecommunications system (universal mobile telecommunications system, UMTS), or an NR (new radio) system.

220. Determine to-be-encoded bits, where the to-be-encoded bits include (K+P) bits, the (K+P) bits include the K information bits and P check bits, the K information bits correspond to K polarization channels, the P check bits include T first-type check bits, all the T first-type check bits are parity check PC bits, reliability of a polarization channel corresponding to each of the T first-type check bits is greater than a minimum value of reliability of the K polarization channels, both P and T are nonnegative integers, and T≤P.

It should be noted that P may be a preset value, but a value of P is not specifically limited in this embodiment of this application, and may be determined based on factors such as the value of the information bit K and a value of a code length N of a polar code. For example, P may be set to 6, 8, or 10.

A type of the P check bits is not specifically limited in this embodiment of this application. For example, the P check bits may be PC bits, or may be any combination of a CRC bit and a PC bit. Optionally, in some embodiments, both P and T are positive integers not less than 1. Optionally, in some embodiments, the P check bits include at least one PC bit. Optionally, in some embodiments, the P check bits may include 0 PC bits.

When the P check bits include a CRC bit, a CRC polynomial corresponding to the CRC bit is not specifically limited in this embodiment of this application.

Optionally, in an implementation, the P check bits may include 3 CRC bits, and a CRC polynomial corresponding to the 3 CRC bits may be $1+x+x^3$. Optionally, in another implementation, the P check bits may include 4 CRC bits, and a CRC polynomial corresponding to the 4 CRC bits may be $1+x+x^2+x^3+x^4$. Optionally, in still another implementation, the P check bits may include 5 CRC bits, and a CRC polynomial corresponding to the 5 CRC bits may be $1+x^2+x^3+x^4+x^5$.

It should be understood that the to-be-encoded bits may further include a frozen bit.

230. Perform polar coding on the to-be-encoded bits to obtain encoded bits, where the (K+P) bits are in a one-to-one correspondence with (K+P) rows in a generator matrix of the encoded bits, a minimum row weight of the (K+P) rows is $W_1$, a maximum row weight corresponding to the T first-type check bits is less than or equal to $W_2$, $W_2$ represents a minimum value other than $W_1$ in row weights of the (K+P) rows, and both $W_1$ and $W_2$ are positive integers not less than 1.

In other words, $W_1$ and $W_2$ are respectively a minimum value and a second minimum value in the row weights corresponding to the (K+P) rows. Alternatively, in some embodiments, $W_2$ may be a third minimum value or a fourth minimum value in the row weights of the (K+P) rows.

It should be understood that in an example in which the code length of the polar code is equal to N, the generator matrix mentioned in this application may be an original generator matrix G or may be a generator matrix G' obtained after a rate matching factor is considered. The original generator matrix G is usually an N×N matrix, and the generator matrix G' obtained after the rate matching factor is considered is a matrix including remaining row vectors obtained by deleting a row vector corresponding to a target bit location from the matrix G The target bit location is a bit location corresponding to a puncturing operation and/or a bit location corresponding to a shortening operation.

240. Transmit the encoded bits to a receive end.

In this embodiment of this application, the T first-type check bits are located at bit locations corresponding to relatively small row weights. Generally, a bit location corresponding to a relatively small row weight corresponds to a polarization channel with relatively low reliability. Therefore, the manner of setting a bit location of a check bit provided in this embodiment of this application can effectively prevent the check bit from occupying a polarization channel with relatively high reliability, thereby avoiding polar code encoding/decoding performance degradation caused by inappropriate setting of the check bit location. In addition, in this embodiment of this application, the reliability of the polarization channel corresponding to each of the first-type check bits is set to be greater than the minimum value of the reliability of the polarization channels corresponding to the K information bits, so that a probability that an error occurs in transmission of the first-type check bits can be avoided to some extent, and a check capability of the first-type check bits can be improved, thereby enhancing polar code encoding/decoding performance on the whole.

Further, an SCL algorithm is usually used for the polar code to perform polar decoding. Generally. SCL algorithm-based decoding performance is a compromise between a code distance of the polar code and reliability. When the code length of the polar code is moderate (for example, N=64), this feature of the SCL algorithm is more prominent. In this embodiment of this application, bit locations of the P check bits are set to bit locations corresponding to relatively small row weights, so that the code distance of the polar code can be increased to some extent, thereby enhancing polar code decoding performance.

Optionally, in an embodiment, the (K+P) rows include t1 first target rows, a row weight of each of the t1 first target rows is $W_1$, the t1 first target rows are in a one-to-one correspondence with t1 polarization channels, the T first-type check bits include f1 first-type check bits, the f1 first-type check bits correspond to f1 polarization channels with highest reliability in the t1 polarization channels, both t1 and f1 are positive integers not less than 1, t1<(K+P), and f1≤P.

It should be understood that the t1 first target rows may be all rows whose row weights are $W_1$ in the (K+P) rows.

In this embodiment of this application, the polarization channels corresponding to the f1 first-type check bits are selected as polarization channels with highest reliability in the t1 polarization channels (polarization channels whose corresponding row weights are $W_1$), so that transmission reliability of the f1 first-type check bits is improved to the maximum extent while it is ensured that the f1 first-type check bits do not occupy a polarization channel with relatively high reliability, thereby improving a check capability of the f1 first-type check bits.

Optionally, in an embodiment, the (K+P) rows include t2 second target rows, a row weight of each of the t2 second target rows is $W_2$, the t2 second target rows are in a one-to-one correspondence with t2 polarization channels, the T first-type check bits include f2 first-type check bits, the f2 first-type check bits correspond to f2 polarization channels with highest reliability in the t2 polarization channels, both t2 and f2 are positive integers not less than 1, t2<(K+P), and f2≤P.

It should be understood that the t2 second target rows may be all rows whose row weights are $W_2$ in the (K+P) rows.

In this embodiment of this application, the polarization channels corresponding to the f2 first-type check bits are selected as polarization channels with highest reliability in the t2 polarization channels (polarization channels whose corresponding row weights are $W_2$), so that transmission reliability of the f2 first-type check bits is improved to the maximum extent while it is ensured that the f2 first-type check bits do not occupy a polarization channel with relatively high reliability, thereby improving a check capability of the f2 first-type check bits.

Optionally, in an embodiment, the P check bits include f3 second-type check bits, all the f3 second-type check bits are PC bits, reliability of polarization channels corresponding to the f3 second-type check bits is less than the reliability of the K polarization channels, f3 is a positive integer not less than 1, and f3≤P.

It should be understood that, that the reliability of the polarization channels corresponding to the f3 second-type check bits is less than the reliability of the K polarization channels may mean that a maximum value of the reliability of the polarization channels corresponding to the f3 second-type check bits is less than the minimum value of the reliability of the K polarization channels.

In this embodiment of this application, the second-type check bits are added for the information bits, and reliability of a polarization channel corresponding to each of the second-type check bits is less than the reliability of the polarization channels corresponding to the information bits, and therefore, the second-type check bits do not affect overall transmission reliability of the information bits. In other words, in this embodiment of this application, the additional check bits are provided for the information bits without affecting overall transmission reliability of the information bits, so that polar code encoding/decoding performance can be further enhanced.

It should be understood that the polar code including the first/second-type check bits may be constructed in an offline manner, and in actual use, the polar code including the first/second-type check bits is directly used for polar coding/decoding.

Figure 3:
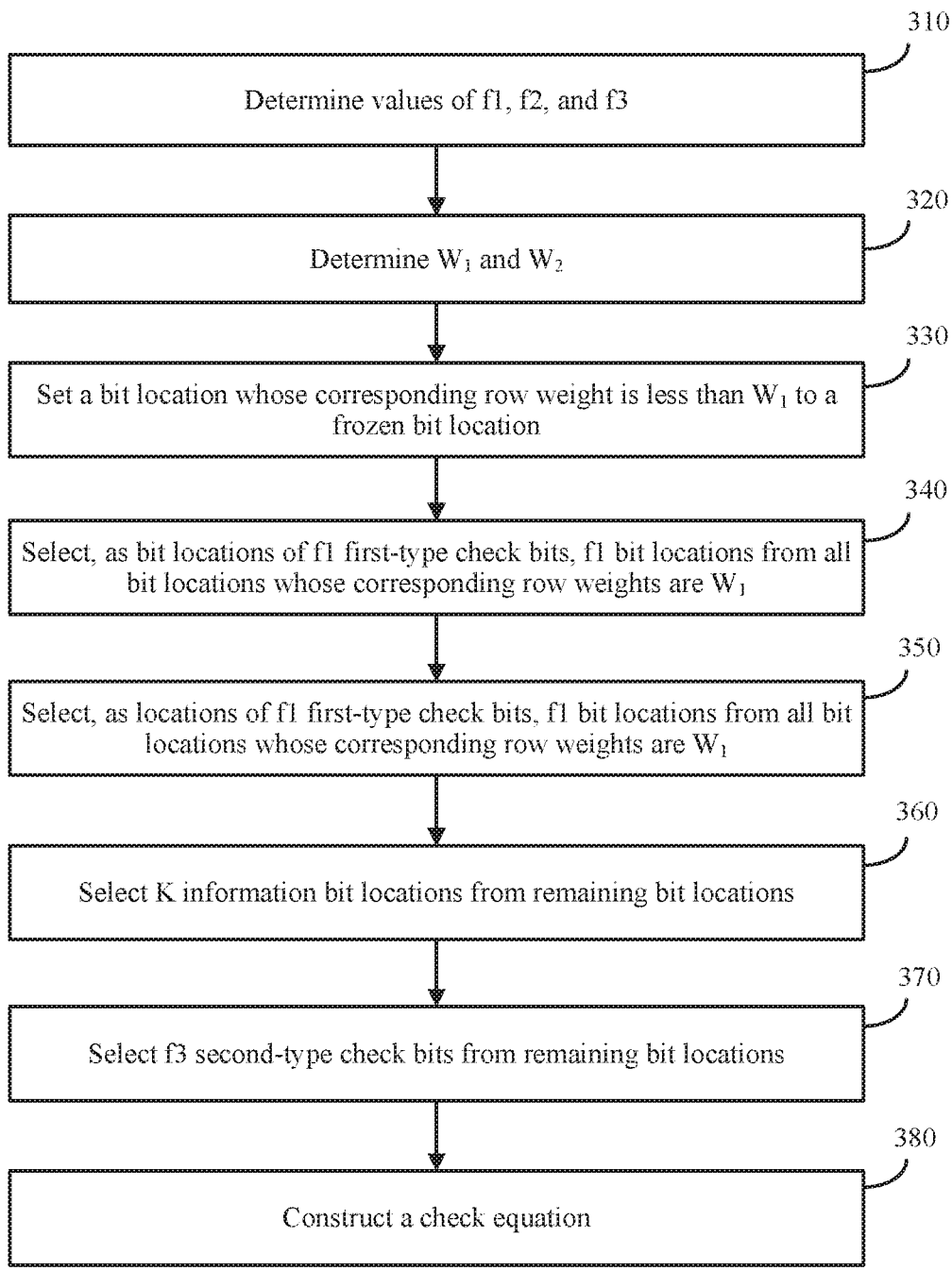
FIG. 3 is a schematic flowchart of a polar code construction manner according to an embodiment of this application.

With reference to FIG. 3, the following uses an example to describe a manner of constructing the polar code including the first/second-type check bits. In the following example, the first-type check bits include the f1 first-type check bits whose corresponding row weights are $W_1$ and the f2 second-type check bits whose corresponding row weights are $W_2$, but this embodiment of this application is not limited thereto. The first-type check bits may alternatively include only the first-type check bits whose corresponding row weights are $W_1$ or only the second-type check bits whose row weights are $W_2$.

310. Determine values of f1, f2, and f3.

First, a total quantity of first-type check bits and second-type check bits needs to be limited, for example, is limited to 8. The total quantity of first-type check bits and second-type check bits may be determined based on factors such as the code length N of the polar code and the quantity K of information bits. For example, when the code length of the polar code is 64, a quantity of first/second-type check bits may be limited to 8. The values of f1, f2, and f3 described in step 310 may be any possible values of f1, f2, and f3 when the total quantity of first-type check bits and second-type check bits is determined. For example, if the total quantity of first-type check bits and second-type check bits is 8, the value of f1 may be set to 2, the value of f2 may be set to 6, and the value of f3 may be set to 2, and then the procedure shown in FIG. 3 is performed.

320. Determine $W_1$ and $W_2$.

Specifically, bit locations of the K information bits, the f1 first-type check bits, and the f2 second-type check bits may be initially selected based on reliability of a polarization channel. For example, if the code length of the polar code is N, and N bit locations are included, (K+f1+f2) bit locations corresponding to highest polarization channel reliability may be selected from the N bit locations. Then row weights of rows in the generator matrix that correspond to the (K+f1+f2) bit locations may be determined. The generator matrix may be an original generator matrix G, or may be a generator matrix G' obtained after the rate matching factor is considered. The original generator matrix G is an N×N matrix, and G' is a matrix including remaining row vectors obtained by deleting a row vector corresponding to a target bit location from the matrix G The target bit location is a bit location corresponding to a puncturing operation and/or a bit location corresponding to a shortening operation. Then, based on the row weights of the rows corresponding to the (K+f1+f2) bit locations, a minimum row weight value $W_{min}$ may be selected and denoted as $W_1$, and a second minimum row weight value may be selected and denoted as $W_2$. In an example in which the generator matrix is an original generator matrix, $W_2$ is usually $2W_1$.

330. Set a bit location whose corresponding row weight is less than $W_1$ to a frozen bit location.

340. Select, as the bit locations of the f2 first-type check bits, f2 bit locations from all bit locations whose corresponding row weights are $W_2$.

Optionally, the f2 bit locations may be selected as the bit locations of the f2 first-type check bits in descending order of reliability from all the bit locations whose corresponding row weights are $W_2$.

350. Select, as the bit locations of the f1 first-type check bits, f1 bit locations from all bit locations whose corresponding row weights are $W_1$.

Optionally, the f1 bit locations may be selected as the bit locations of the f1 first-type check bits in descending order of reliability from all the bit locations whose corresponding row weights are $W_1$.

360. Select K information bit locations from remaining bit locations.

It should be understood that the remaining locations in step 360 are remaining bit locations other than the bit locations corresponding to the first-type check bits, bit locations or a bit location (if there is any) corresponding to a puncturing operation and/or a shortening operation, and the frozen bit location determined in step 330.

For example, K bit locations corresponding to highest polarization channel reliability in the remaining bit locations may be selected as the bit locations of the K information bits.

370. Select f3 second-type check bit locations from remaining bit locations.

It should be understood that the remaining locations described in step 370 are remaining bit locations other than the information bit locations, the locations of the first-type check bits, the bit locations or the bit location (if there is any) corresponding to the puncturing operation and/or the shortening operation, and the frozen bit location determined in step 330.

There may be a plurality of manners of selecting f3 second-type check bits. For example, f3 bit locations corresponding to highest polarization channel reliability may be selected as the bit locations of the f3 second-type check bits from the remaining bit locations. For another example, f3 bit locations with highest bit location sequence numbers may be selected as the bit locations of the f3 second-type check bits from the remaining bit locations. For parity check, a higher sequence number of a check bit location indicates that more information bits may be checked.

380. Construct a check equation.

After the bit locations of the information bits, the first-type check bits, and the second-type check bits are determined, the check equation needs to be constructed, to determine an information bit that is to be checked by using each check bit. The check equation may be constructed in a plurality of manners. For example, the check equation may be constructed through a cyclic shift, or the check equation may be constructed according to a rule of maximizing a quantity of information bits checked by using a check bit, or the check equation may be constructed according to a rule of optimizing polar code transmission performance. This is not specifically limited in this embodiment of this application. The following provides detailed descriptions with reference to a specific embodiment, and details are not described herein again. After the check equation is constructed, if any information bit preceding a check bit cannot be checked by using the check bit according to a check rule of the check equation, a bit location corresponding to the check bit may be converted into a bit location corresponding to a frozen bit. For example, the check rule may be set as follows: A difference between a location sequence number of a check bit and a location sequence number of an information bit checked by using the check bit is an integer multiple of a fixed prime number (for example, an integer multiple of 5). According to this rule, if a difference between a location sequence number of a check bit and a location sequence number of none of information bits is equal to an integer multiple of the fixed prime number, a location of the check bit may be degraded to a frozen bit location.

It should be noted that if the polar code rate matching manner is puncturing and/or shortening, bit locations or a bit location corresponding to the puncturing operation and/or the shortening operation need or needs to be skipped in a process of selecting a bit location.

It should be further noted that the process described in FIG. 3 is a processing process after the values of f1, f2, and f3 are determined. During construction of a polar code, various value combinations of f1, f2, and f3 may be traversed, and the procedure shown in FIG. 3 is performed once based on each value combination, to obtain a specific form of a polar code in the case of the value combination. Then performance of polar codes corresponding to all the value combinations is tested to obtain a polar code with better performance. The performance of the polar code may be represented by a value of a signal-to-noise ratio required in a case of a specific BLER value. A smaller value of the signal-to-noise ratio indicates higher performance of the polar code. Alternatively, in some implementations, a value of a parameter in f1, f2, and f3 may also be prelimited, to reduce a quantity of value combinations that need to be traversed, and improve polar code construction efficiency. For example, a sum of f1, f2, and f3 may be limited to 8, and the value of f3 is limited to 2. For another example, only a sum of f1, f2, and f3 may be limited to 8.

Optionally, in an embodiment, the T first-type check bits correspond to T polarization channels, the polarization channels corresponding to the f3 second-type check bits are 13 polarization channels with highest reliability other than the K polarization channels and the T polarization channels in M polarization channels, the M polarization channels are remaining polarization channels other than polarization channels or a polarization channel corresponding to a puncturing operation and/or a shortening operation in polarization channels used for the polar coding, and M is a positive integer not less than 1.

It should be understood that if the polar code rate matching manner is not a puncturing operation or a shortening operation, M may be equal to N.

For example, if the polar code rate matching manner is a puncturing operation or a shortening operation, the N bit locations of the polar code include some bit locations that are removed by a subsequent puncturing operation and/or a subsequent shortening operation. In this embodiment of this application, the bit locations are first excluded from the N bit locations to obtain remaining M bit locations, and the M bit locations correspond to M polarization channels. (K+T) polarization channels in the M polarization channels are occupied by the K information bits and the T first-type check bits, and the f3 second-type check bits occupy f3 polarization channels with highest reliability other than the (K+T) polarization channels in the M polarization channels, so that transmission reliability of the second-type check bits can be improved to the maximum extent.

Optionally, in an embodiment, the T first-type check bits correspond to T polarization channels, the polarization channels corresponding to the f3 second-type check bits are f3 polarization channels with highest polarization channel sequence numbers other than the K polarization channels and the T polarization channels in M polarization channels, the M polarization channels are remaining polarization channels other than polarization channels or a polarization channel corresponding to a puncturing operation and/or a shortening operation in polarization channels used for the polar coding, and M is a positive integer not less than 1.

It should be understood that if the polar code rate matching manner is not a puncturing operation or a shortening operation, M may be equal to N.

For example, if the polar code rate matching manner is a puncturing operation or a shortening operation, the N bit locations of the polar code include some bit locations that are removed by a subsequent puncturing operation and/or a subsequent shortening operation. In this embodiment of this application, the bit locations are first excluded from the N bit locations to obtain remaining M bit locations, and the M bit locations correspond to M polarization channels. (K+T) polarization channels in the M polarization channels are occupied by the K information bits and the T first-type check bits, and the f3 second-type check bits occupy f3 polarization channels with highest polarization channel sequence numbers other than the (K+T) polarization channels in the M polarization channels.

It should be understood that if a sequence number of a bit location of the polar code is i, it indicates that the bit location is the $i^{th}$ bit location in the N bit locations of the polar code, and a polarization channel sequence number corresponding to the bit location is also i, where i is a positive integer, and $1 \leq i \leq N$ or $0 \leq i \leq N-1$.

If a PC bit corresponds to a higher polarization channel sequence number, the PC bit has a more rear bit location in the polar code, and more information bits can be checked by using the PC bit, increasing an information bit check probability.

Optionally, in an embodiment, a difference between a location sequence number of each PC bit in the P check bits in the to-be-encoded bits and a location sequence number of each information bit in the to-be-encoded bits that is checked by using each PC bit is an integer multiple of a preset prime number.

An information bit and a check bit in the check equation provided in this embodiment of this application need to meet the following relationship: A difference between a location sequence number of the information bit and a location sequence number of the check bit is an integer multiple of a preset prime number. A value of the preset prime number is not specifically limited in this embodiment of this application. For example, the value of the preset prime number may be 5 or 3. This check equation has a simple form and is easy to implement.

Optionally, in an embodiment, each PC bit in the P check bits and each information bit checked by using each PC bit meet the following conditions: if $g_i = g_j$, a Hamming weight of $g_k$ is greater than a Hamming weight of each of $g_i$ and $g_j$; and if $g_i \neq g_j$, a Hamming weight of $g_k$ is greater than a minimum value of Hamming weights of $g_i$ and $g_j$, where $g_i$ represents a row vector that is in the generator matrix and that corresponds to each PC bit, $g_j$ represents a row vector that is in the generator matrix and that corresponds to each information bit, $g_k = \mod(g_i + g_j, 2)$, and $\mod(.)$ represents a modulo operation.

An example in which the check equation is [ . . . . , $u_i$, . . . , $u_j$] is used for description. Any information bit $u_i$ in the check equation may correspond to a row vector $g_i$ in the generator matrix, a PC bit $u_j$ corresponds to a row vector $g_j$ in the generator matrix, and a Hamming weight of a modulo 2 sum vector $g_k$ of $g_i$ and $g_j$ meets the following conditions: If $g_i = g_j$, a Hamming weight of $g_k$ is greater than a Hamming weight of each of $g_i$ and $g_j$; and if $g_i \neq g_j$, a Hamming weight of $g_k$ is greater than a minimum value of Hamming weights of $g_i$ and $g_j$, where $g_i$ represents a row vector that is in the generator matrix and that corresponds to each PC bit, $g_j$ represents a row vector that is in the generator matrix and that corresponds to each information bit, $g_k = \mod(g_i + g_j, 2)$, and $\mod(.)$ represents a modulo operation. When the Hamming weight of $g_k$ meets the foregoing conditions, a code distance of the polar code can be increased to some extent, thereby enhancing polar code encoding/decoding performance.

The foregoing describes in detail the data transmission method provided in the embodiments of this application from a perspective of a transmit end with reference to FIG. 2. The following describes the data transmission method provided in the embodiments of this application from a perspective of a receive end with reference to FIG. 4.

It should be understood that a data processing process described from the perspective of the transmit end and a data processing process described from the perspective of the receive end are basically inverse processes. For example, decoded bits obtained by the receive end through polar decoding described in FIG. 4 correspond to the to-be-encoded bits in FIG. 2. Therefore, repeated descriptions are appropriately omitted for brevity.

Figure 4:
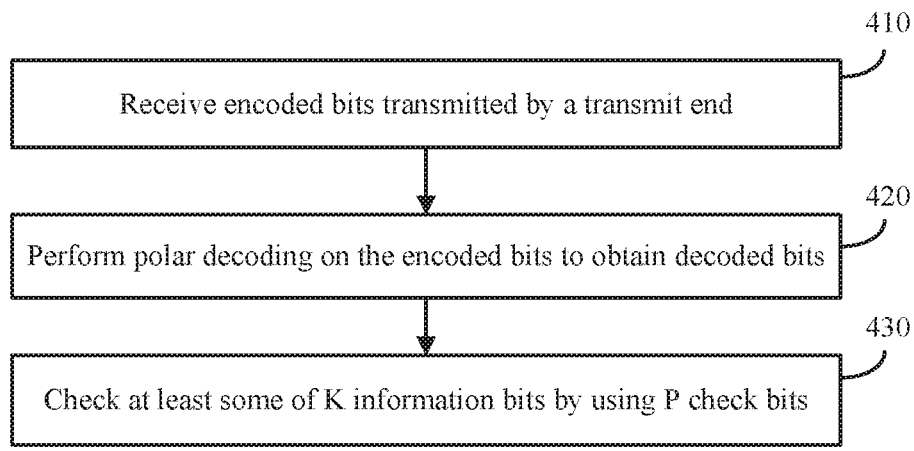
FIG. 4 is a schematic flowchart of a data transmission method according to another embodiment of this application.

FIG. 4 is a schematic flowchart of a data transmission method according to another embodiment of this application. The method in FIG. 4 includes the following steps.

410. Receive encoded bits transmitted by a transmit end.

420. Perform polar decoding on the encoded bits to obtain decoded bits, where the decoded bits include (K+P) bits, the (K+P) bits include K information bits and P check bits, the K information bits correspond to K polarization channels, the P check bits include T first-type check bits, all the T first-type check bits are parity check PC bits, reliability of a polarization channel corresponding to each of the T first-type check bits is greater than a minimum value of reliability of the K polarization channels, the (K+P) bits are in a one-to-one correspondence with (K+P) rows in a generator matrix of the encoded bits, a minimum row weight of the (K+P) rows is $W_1$, a maximum row weight corresponding to the T check bits is less than or equal to $W_2$, $W_2$ represents a minimum value other than $W_1$ in row weights of the (K+P) rows, both $W_1$ and $W_2$ are positive integers not less than 1, both P and T are nonnegative integers, T≤P, and all of K, $W_1$, and $W_2$ are positive integers not less than 1.

430. Check at least some of the K information bits by using the P check bits.

In this embodiment of this application, the T first-type check bits are located at bit locations corresponding to relatively small row weights. Generally, a bit location corresponding to a relatively small row weight corresponds to a polarization channel with relatively low reliability. Therefore, the manner of setting a bit location of a check bit provided in this embodiment of this application can effectively prevent the check bit from occupying a polarization channel with relatively high reliability, thereby avoiding polar code encoding/decoding performance degradation caused by inappropriate setting of the check bit location. In addition, in this embodiment of this application, the reliability of the polarization channel corresponding to each of the first-type check bits is set to be greater than the minimum value of the reliability of the polarization channels corresponding to the K information bits, so that a probability that an error occurs in transmission of the first-type check bits can be avoided to some extent, and a check capability of the first-type check bits can be improved, thereby enhancing polar code encoding/decoding performance on the whole.

Optionally, in an embodiment, the (K+P) rows include t1 first target rows, a row weight of each of the t1 first target rows is $W_1$, the t1 first target rows are in a one-to-one correspondence with t1 polarization channels, the T first-type check bits include f1 first-type check bits, the f1 first-type check bits correspond to f1 polarization channels with highest reliability in the t1 polarization channels, both t1 and f1 are positive integers not less than 1, t1<(K+P), and f1≤P.

Optionally, in an embodiment, the (K+P) rows include t2 second target rows, a row weight of each of the t2 second target rows is $W_2$, the t2 second target rows are in a one-to-one correspondence with t2 polarization channels, the T first-type check bits include f2 first-type check bits, the f2 first-type check bits correspond to f2 polarization channels with highest reliability in the t2 polarization channels, both t2 and f2 are positive integers not less than 1, t2<(K+P), and f2≤P.

Optionally, in an embodiment, the K information bits correspond to the K polarization channels, the P check bits include f3 second-type check bits, all the f3 second-type check bits are PC bits, reliability of polarization channels corresponding to the f3 second-type check bits is less than the reliability of the K polarization channels, f3 is a positive integer not less than 1, and f3≤P.

Optionally, in an embodiment, the T first-type check bits correspond to T polarization channels, the polarization channels corresponding to the f3 second-type check bits are f3 polarization channels with highest reliability other than the K polarization channels and the T polarization channels in M polarization channels, the M polarization channels are remaining polarization channels other than polarization channels or a polarization channel corresponding to a puncturing operation and/or a shortening operation in polarization channels used for the polar decoding, and M is a positive integer not less than 1.

Optionally, in an embodiment, the T first-type check bits correspond to T polarization channels, the polarization channels corresponding to the f3 second-type check bits are f3 polarization channels with highest polarization channel sequence numbers other than the K polarization channels and the T polarization channels in M polarization channels, the M polarization channels are remaining polarization channels other than polarization channels or a polarization channel corresponding to a puncturing operation and/or a shortening operation in polarization channels used for the polar decoding, and M is a positive integer not less than 1.

Optionally, in an embodiment, a difference between a location sequence number of each PC bit in the P check bits in the decoded bits and a location sequence number of each information bit in the decoded bits that is checked by using each PC bit is an integer multiple of a preset prime number.

Optionally, in an embodiment, each PC bit in the P check bits and each information bit checked by using each PC bit meet the following conditions:

if $g_i = g_j$, a Hamming weight of $g_k$ is greater than a Hamming weight of each of $g_i$ and $g_j$; and if $g_i \neq g_j$, a Hamming weight of $g_k$ is greater than a minimum value of Hamming weights of $g_i$ and $g_j$, where $g_i$ represents a row vector that is in the generator matrix and that corresponds to each PC bit, $g_j$ represents a row vector that is in the generator matrix and that corresponds to each information bit, $g_k = \mod(g_i + g_j, 2)$, and mod(.) represents a modulo operation.

Optionally, in an embodiment, all the P check bits are PC bits, or the P check bits include a PC bit and a CRC bit.

A specific form of the polar code used in the data transmission processes described in FIG. 2 to FIG. 4 is described below by using examples with reference to specific embodiments. It should be noted that the following examples are merely intended to help a person skilled in the art understand the embodiments of this application, instead of limiting the embodiments of this application to a specific value or a specific scenario shown in the examples. A person skilled in the art can apparently make various equivalent modifications or changes based on the provided examples, and such modifications or changes also fall within the scope of the embodiments of this application.

Embodiment 1

All check bits in this embodiment are PC bits. Further, in this embodiment, a check equation is generated by using a cyclic shift register, and 5 is selected as a quantity of bits of the cyclic shift register (indicating that a difference between a location sequence number of a check bit and a location sequence number of an information bit is an integer multiple of 5). In addition, in this embodiment, a length N of a mother code vector is 64, a total quantity of first-type check bits and second-type check bits is 8, and a quantity of second-type check bits is limited to 2. In addition, a manner of selecting bit locations of the second-type check bits in this embodiment is limited as follows: Two bit locations corresponding to highest polarization channel reliability are selected as the bit locations of the second-type check bits from remaining bit locations (bit locations other than information bit locations, locations of the first-type check bits, and a bit location corresponding to a puncturing operation or a shortening operation). Under the foregoing condition limitation, the following uses examples to describe possible forms of a polar code constructed in Embodiment 1.

When M=48 and K=12, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [27], [28], [29], [32], [33], [34], [35], [36], [37], [38], [39], [40], [41], [42], [43], [44], [48], [49], [50], [52], [56]} sequence numbers of check bit locations of the polar code:

{[58], [60], [61], [62]} check equation of the polar code:

[53, 58], [30, 45, 55, 60], [31, 46, 51, 61], [47, 57, 62]. To be specific, a check bit whose location sequence number is 58 is used to check an information bit whose location sequence number is 53, a check bit whose location sequence number is 60 is used to check information bits whose location sequence numbers are 30, 45, and 55, a check bit whose location sequence number is 61 is used to check information bits whose location sequence numbers are 31, 46, and 51, and a check bit whose location sequence number is 62 is used to check information bits whose location sequence numbers are 47 and 57. A definition manner of and a check relationship between a check bit and an information bit in a check equation occurring below are similar to those in the foregoing description, and details are not described again later.

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=13, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [27], [28], [29], [32], [33], [34], [35], [36], [37], [38], [39], [40], [41], [42], [44], [48], [49], [50], [52]} sequence numbers of check bit locations of the polar code:

{[56], [58], [60], [61], [62]} check equation of the polar code:

[31, 46, 51, 56], [43, 53, 58], [30, 45, 55, 60], [31, 46, 51, 61], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=14, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [27], [28], [32], [33], [34], [35], [36], [37], [38], [39], [40], [41], [42], [44], [48], [49], [50], [52]} sequence numbers of check bit locations of the polar code:

{[39], [56], [58], [60], [61], [62]} check equation of the polar code:

[29, 39], [31, 46, 51, 56], [43, 53, 58], [30, 45, 55, 60], [31, 46, 51, 61], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=15, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [27], [28], [32], [33], [34], [35], [36], [37], [38], [40], [41], [42], [44], [48], [49], [50], [52]} sequence numbers of check bit locations of the polar code:

{[39], [56], [58], [60], [62]} check equation of the polar code:

[29, 39], [31, 46, 51, 56], [43, 53, 58], [30, 45, 55, 60], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=16, a polar code in the following form may be used:

sequence numbers of bit locations of the polar code that correspond to a puncturing operation or a shortening operation:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [27], [28], [32], [33], [34], [35], [36], [37], [38], [40], [41], [42], [44], [48], [49], [50]} sequence numbers of check bit locations of the polar code:

{[39], [52], [56], [58], [60]} check equation of the polar code:

[29, 39], [47, 52], [31, 46, 51, 56], [43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=17, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [27], [28], [32], [33], [34], [35], [36], [37], [38], [40], [41], [42], [44], [48], [49], [50]} sequence numbers of check bit locations of the polar code:

{[39], [52], [56], [60]} check equation of the polar code:

[29, 39], [47, 52], [31, 46, 51, 56], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=18, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [27], [28], [32], [33], [34], [35], [36], [37], [38], [40], [41], [42], [44], [48], [49], [50]} sequence numbers of check bit locations of the polar code:

{[44], [49], [50], [52], [56], [58], [60]} check equation of the polar code:

[29, 39, 44], [29, 39, 49], [30, 45, 50], [27, 47, 52], [31, 46, 51, 56], [43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=19, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [28], [32], [33], [34], [35], [36], [37], [38], [40], [41], [48]} sequence numbers of check bit locations of the polar code:

{[42], [44], [49], [50], [52], [56], [60]} check equation of the polar code:

[27, 42], [29, 39, 44], [29, 39, 49], [30, 45, 50], [27, 47, 52], [31, 46, 51, 56], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=20, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [28], [32], [33], [34], [35], [36], [37], [38], [40], [41], [42], [48]} sequence numbers of check bit locations of the polar code:

{[44], [49], [50], [52], [56]} check equation of the polar code:

[29, 39, 44], [29, 39, 49], [30, 45, 50], [27, 47, 52], [31, 46, 51, 56].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=21, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [24], [25], [26], [28], [32], [33], [34], [35], [36], [37], [38], [40], [41], [48]} sequence numbers of check bit locations of the polar code:

{[42], [44], [49], [50], [52], [56]} check equation of the polar code:

[27, 42], [29, 39, 44], [29, 39, 49], [30, 45, 50], [27, 47, 52], [31, 46, 51, 56].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=22, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [24], [25], [26], [28], [32], [33], [34], [35], [36], [37], [38], [40], [41], [48]} sequence numbers of check bit locations of the polar code:

{[42], [49], [52], [56], [60]} check equation of the polar code:

[27, 42], [29, 39, 44, 49], [27, 47, 52], [31, 46, 51, 56], [30, 45, 50, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=12, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [43], [44], [48], [49], [50], [52], [56]} sequence numbers of check bit locations of the polar code:

{[55], [59], [61], [62]} check equation of the polar code:

[30, 45, 55], [54, 59], [31, 46, 51, 61], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=13, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [39], [40], [41], [42], [44], [48], [49], [50], [52]} sequence numbers of check bit locations of the polar code:

{[39], [55], [56], [59], [60], [61], [62]} check equation of the polar code:

[29, 39], [30, 45, 55], [31, 46, 51, 56], [29, 54, 59], [30, 45, 60], [31, 46, 51, 61], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=14, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [39], [40], [41], [42], [43], [44], [48], [49], [50], [52]} sequence numbers of check bit locations of the polar code:

{[39], [55], [56], [59], [61], [62]} check equation of the polar code:

[29, 39], [30, 45, 55], [31, 46, 51, 56], [29, 54, 59], [31, 46, 51, 61], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=15, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [40], [41], [42], [44], [48], [49], [50], [52]} sequence numbers of check bit locations of the polar code:

{[39], [56], [60], [61], [62]} check equation of the polar code:

[29, 39], [31, 46, 51, 56], [30, 45, 55, 60], [31, 46, 51, 61], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=16, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [44], [48], [49], [50]} sequence numbers of check bit locations of the polar code:

{[52], [54], [56], [57], [58], [60]} check equation of the polar code:

[27, 47, 52], [29, 39, 54], [31, 46, 51, 56], [27, 47, 57], [43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=17, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [48], [49]} sequence numbers of check bit locations of the polar code:

{[44], [50], [52], [56], [57], [58], [60]} check equation of the polar code:

[29, 39, 44], [30, 45, 50], [27, 47, 52], [31, 46, 51, 56], [27, 47, 57], [43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=18, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [48], [49]} sequence numbers of check bit locations of the polar code:

{[44], [50], [52], [56], [58], [60]} check equation of the polar code:

[29, 39, 44], [30, 45, 50], [27, 47, 52], [31, 46, 51, 56], [43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=19, a polar code in the following form may be used:

sequence numbers of frozen bit locations of the polar code:

{[0], [1], [2], [3], [4], [5], [6], [7], [8], [8], [10], [11], [12], [13], [14], [15], [16], [17], [18], [19], [20], [21], [22], [24], [25], [26], [28], [32], [33], [34], [35], [36], [37], [38], [40], [41], [42], [48]} sequence numbers of check bit locations of the polar code:

{[44], [49], [50], [52], [56], [58], [60]} check equation of the polar code:

[29, 39, 44], [29, 39, 49], [30, 45, 50], [27, 47, 52], [31, 46, 51, 56], [23, 43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=20, sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [42], [48], [49]} sequence numbers of check bit locations of the polar code:

{[44], [50], [52], [56], [60]} check equation of the polar code:

[29, 39, 44], [30, 45, 50], [27, 47, 52], [31, 46, 51, 56], [30, 45, 55, 60]

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=21, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [42], [48]} sequence numbers of check bit locations of the polar code:

{[44], [49], [50], [52], [56]} check equation of the polar code:

[29, 39, 44], [29, 39, 49], [30, 45, 50], [27, 47, 52], [31, 46, 51, 56].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=22, a polar code in the following form may be used:

sequence numbers of frozen bit locations of the polar code:

{[0], [1], [2], [3], [4], [5], [6], [7], [8], [9], [10], [11], [12], [13], [14], [16], [17], [18], [19], [20], [21], [22], [24], [25], [26], [32], [33], [34], [35], [36], [37], [38], [40], [41], [48]} sequence numbers of check bit locations of the polar code:

{[28], [42], [44], [49], [50], [52], [56]} check equation of the polar code:

[23, 28], [27, 42], [29, 39, 44], [29, 39, 49], [15, 30, 45, 50], [27, 47, 52], [31, 46, 51, 56].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

It should be understood that in Embodiment 1, the total quantity of check bits is limited to 8, but a total quantity of check bits of a polar code that are actually provided may not be 8, because a location sequence number of each of some check bits and a location sequence number of none of information bits meet a preset check equation, that is, neither the location sequence number of the check bit nor a location sequence number of an information bit is an integer multiple of 5. Therefore, the check bit cannot be used to check any information bit. In this case, in this embodiment, the check bit location is degraded to a frozen bit location. This also applies to the following embodiments.

Embodiment 2

Embodiment 2 is roughly similar to Embodiment 1, except that in Embodiment 2, only a total quantity of first-type check bits and second-type check bits is limited to 8, and a quantity of second-type check bits is not limited to 2. A structure of a polar code constructed in Embodiment 2 is as follows:

When M=48 and K=12, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [27], [28], [29], [32], [33], [34], [35], [36], [37], [38], [39], [40], [41], [42], [43], [44], [48], [49], [50], [52]} sequence numbers of check bit locations of the polar code:

{[56], [58], [60], [61], [62]} check equation of the polar code:

[31, 46, 51, 56], [53, 58], [30, 45, 55, 60], [31, 46, 51, 61], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=13, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [27], [28], [29], [32], [33], [34], [35], [36], [37], [38], [39], [40], [41], [42], [44], [48], [49], [50], [52]} sequence numbers of check bit locations of the polar code:

{[56], [58], [60], [61], [62]} check equation of the polar code:

[31, 46, 51, 56], [43, 53, 58], [30, 45, 55, 60], [31, 46, 51, 61], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=14, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [27], [28], [32], [33], [34], [35], [36], [37], [38], [40], [41], [42], [44], [48], [49], [50]} sequence numbers of check bit locations of the polar code:

{[39], [52], [56], [58], [60], [61], [62]} check equation of the polar code:

[29, 39], [47, 52], [31, 46, 51, 56], [43, 53, 58], [30, 45, 55, 60], [31, 46, 51, 61], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=15, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [27], [28], [32], [33], [34], [35], [36], [37], [38], [40], [41], [42], [44], [48], [49], [50]} sequence numbers of check bit locations of the polar code:

{[39], [52], [56], [58], [60], [62]} check equation of the polar code:

[29, 39], [47, 52], [31, 46, 51, 56], [43, 53, 58], [30, 45, 55, 60], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=16, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [27], [28], [32], [33], [34], [35], [36], [37], [38], [40], [41], [42], [44], [48], [49]} sequence numbers of check bit locations of the polar code:

{[39], [50], [52], [56], [58], [60]} check equation of the polar code:

[29, 39], [30, 45, 50], [47, 52], [31, 46, 51, 56], [43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=17, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [27], [28], [32], [33], [34], [35], [36], [37], [38], [40], [41], [42], [48], [49]} sequence numbers of check bit locations of the polar code:

{[39], [44], [50], [52], [56], [60]} check equation of the polar code:

[29, 39], [29, 44], [30, 45, 50], [47, 52], [31, 46, 51, 56], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=18, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [28], [32], [33], [34], [35], [36], [37], [38], [40], [41], [42], [48]} sequence numbers of check bit locations of the polar code:

{[44], [49], [50], [52], [56], [58], [60]} check equation of the polar code:

[29, 39, 44], [29, 39, 49], [30, 45, 50], [27, 47, 52], [31, 46, 51, 56], [43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=19, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [28], [32], [33], [34], [35], [36], [37], [38], [40], [41], [48]} sequence numbers of check bit locations of the polar code:

{[42], [44], [49], [50], [52], [56], [60]} check equation of the polar code:

[27, 42], [29, 39, 44], [29, 39, 49], [30, 45, 50], [27, 47, 52], [31, 46, 51, 56], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=20, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [28], [32], [33], [34], [35], [36], [37], [38], [40], [41], [48]} sequence numbers of check bit locations of the polar code:

{[42], [44], [49], [50], [52], [56]} check equation of the polar code:

[27, 42], [29, 39, 44], [29, 39, 49], [30, 45, 50], [27, 47, 52], [31, 46, 51, 56].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=21, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [24], [25], [26], [32], [33], [34], [35], [36], [37], [38], [40], [48]} sequence numbers of check bit locations of the polar code:

{[28], [41], [44], [49], [50], [52], [56]} check equation of the polar code:

[23, 28], [31, 41], [29, 39, 44], [29, 39, 49], [30, 45, 50], [27, 47, 52], [31, 46, 51, 56].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=22, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [24], [25], [26], [32], [33], [34], [35], [36], [37], [40], [48]} sequence numbers of check bit locations of the polar code:

{[28], [38], [41], [42], [49], [52], [56], [60]} check equation of the polar code:

[23, 28], [23, 38], [31, 41], [27, 42], [29, 39, 44, 49], [27, 47, 52], [31, 46, 51, 56], [30, 45, 50, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=12, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [43], [44], [48], [49], [50], [52]} sequence numbers of check bit locations of the polar code:

{[55], [56], [59], [61], [62]} check equation of the polar code:

[30, 45, 55], [31, 46, 51, 56], [54, 59], [31, 46, 51, 61], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=13, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [40], [41], [42], [44], [48], [49], [50], [52]} sequence numbers of check bit locations of the polar code:

{[39], [55], [56], [59], [60], [61], [62]} check equation of the polar code:

[29, 39], [30, 45, 55], [31, 46, 51, 56], [29, 54, 59], [30, 45, 60], [31, 46, 51, 61], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=14, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [40], [41], [42], [44], [48], [49], [50]} sequence numbers of check bit locations of the polar code:

{[39], [52], [55], [56], [59], [61], [62]} check equation of the polar code:

[29, 39], [47, 52], [30, 45, 55], [31, 46, 51, 56], [29, 54, 59], [31, 46, 51, 61], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=15, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [40], [41], [42], [44], [48], [49], [50]} sequence numbers of check bit locations of the polar code:

{[39], [52], [56], [60], [61], [62]} check equation of the polar code:

[29, 39], [47, 52], [31, 46, 51, 56], [30, 45, 55, 60], [31, 46, 51, 61], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=16, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [44], [48], [49]} sequence numbers of check bit locations of the polar code:

{[50], [52], [54], [56], [57], [58], [60]} check equation of the polar code:

[30, 45, 50], [27, 47, 52], [29, 39, 54], [31, 46, 51, 56], [27, 47, 57], [43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=17, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [48], [49]} sequence numbers of check bit locations of the polar code:

{[44], [50], [52], [56], [57], [58], [60]} check equation of the polar code:

[29, 39, 44], [30, 45, 50], [27, 47, 52], [31, 46, 51, 56], [27, 47, 57], [43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=18, a polar code in the following form may be used:

sequence numbers of frozen bit locations of the polar code:

{[0], [1], [2]1 [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [48]} sequence numbers of check bit locations of the polar code:

{[44], [49], [50], [52], [56], [58], [60]} check equation of the polar code:

[29, 39, 44], [29, 39, 49], [30, 45, 50], [27, 47, 52], [31, 46, 51, 56], [43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=19, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [42], [48]} sequence numbers of check bit locations of the polar code:

{[44], [50], [52], [56], [58], [60]} check equation of the polar code:

[29, 39, 44], [30, 45, 50], [27, 47, 52], [31, 46, 51, 56], [23, 43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=20, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [48]} sequence numbers of check bit locations of the polar code:

{[42], [44], [49], [50], [52], [56], [60]} check equation of the polar code:

[27, 42], [29, 39, 44], [29, 39, 49], [30, 45, 50], [27, 47, 52], [31, 46, 51, 56], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=21, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [24], [25], [26], [32], [33], [34], [35], [36], [37], [38], [40], [41], [48]} sequence numbers of check bit locations of the polar code:

{[28], [42], [44], [49], [50], [52], [56]} check equation of the polar code:

[23, 28], [27, 42], [29, 39, 44], [29, 39, 49], [30, 45, 50], [27, 47, 52], [31, 46, 51, 56].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=22, a polar code in the following form may be used:

sequence numbers of frozen bit locations of the polar code:

{[0], [1], [2], [3], [4], [5], [6], [7], [8], [9], [10], [11], [12], [13], [14], [16], [17], [18], [19], [20], [21], [22], [24], [25], [26], [32], [33], [34], [35], [36], [37], [38], [40], [48]} sequence numbers of check bit locations of the polar code:

{[28], [41], [42], [44], [49], [50], [52], [56]} check equation of the polar code:

[23, 28], [31, 41], [27, 42], [29, 39, 44], [29, 39, 49], [15, 30, 45, 50], [27, 47, 52], [31, 46, 51, 56].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

Embodiment 3

Embodiment 3 is roughly similar to Embodiment 1, except that in Embodiment 1, two bit locations corresponding to highest polarization channel reliability are selected as bit locations of second-type check bits from remaining bit locations (bit locations other than information bit locations, locations of first-type check bits, and a bit location corresponding to a puncturing operation or a shortening operation), and in Embodiment 3, two bit locations with highest location sequence numbers (the location sequence number is a location sequence number of a bit location, and is also a location sequence number of a polarization channel) are selected as bit locations of second-type bits from the remaining bit locations. A structure of a polar code constructed in Embodiment 3 is as follows:

When M=48 and K=12, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [27], [28], [29], [32], [33], [34], [35], [36], [37], [38], [39], [40], [41], [42], [43], [44], [48], [49], [50]} sequence numbers of check bit locations of the polar code:

{[52], [56], [58], [60], [61], [62]} check equation of the polar code:

[47, 52], [31, 46, 51, 56], [53, 58], [30, 45, 55, 60], [31, 46, 51, 61], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=13, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [27], [28], [29], [32], [33], [34], [35], [36], [37], [38], [39], [40], [41], [42], [44], [48], [49], [50]} sequence numbers of check bit locations of the polar code:

{[52], [56], [58], [60], [61], [62]} check equation of the polar code:

[47, 52], [31, 46, 51, 56], [43, 53, 58], [30, 45, 55, 60], [31, 46, 51, 61], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=14, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [27], [28], [32], [33], [34], [35], [36], [37], [38], [39], [40], [41], [42], [44], [48], [49], [50]} sequence numbers of check bit locations of the polar code:

{[52], [54], [56], [57], [58], [60]} check equation of the polar code:

[47, 52], [29, 54], [31, 46, 51, 56], [47, 57], [43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=15, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [27], [28], [32], [33], [34], [35], [36], [37], [38], [39], [40], [41], [42], [44], [48], [49], [50]} sequence numbers of check bit locations of the polar code:

{[52], [56], [58], [60], [62]} check equation of the polar code:

[47, 52], [31, 46, 51, 56], [43, 53, 58], [30, 45, 55, 60], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=16, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [27], [28], [32], [33], [34], [35], [36], [37], [38], [39], [40], [41], [42], [44], [48], [49]} sequence numbers of check bit locations of the polar code:

{[50], [52], [56], [58], [60]} check equation of the polar code:

[30, 45, 50], [47, 52], [31, 46, 51, 56], [43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=17, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [27], [28], [32], [33], [34], [35], [36], [37], [38], [40], [41], [42], [44], [48], [49]} sequence numbers of check bit locations of the polar code:

{[50], [52], [56], [58], [60]} check equation of the polar code:

[30, 45, 50], [47, 52], [31, 46, 51, 56], [43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=18, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [28], [32], [33], [34], [35], [36], [37], [38], [40], [41], [42], [44], [48]} sequence numbers of check bit locations of the polar code:

{[49], [50], [52], [56], [58], [60]} check equation of the polar code:

[29, 39, 49], [30, 45, 50], [27, 47, 52], [31, 46, 51, 56], [43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=19, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [28], [32], [33], [34], [35], [36], [37], [38], [40], [41], [42], [44], [48]} sequence numbers of check bit locations of the polar code:

{[49], [50], [52], [56], [60]} check equation of the polar code:

[29, 39, 49], [30, 45, 50], [27, 47, 52], [31, 46, 51, 56], [30, 45, 55, 60]

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=20, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [28], [32], [33], [34], [35], [36], [37], [38], [40], [41], [42], [44], [48]} sequence numbers of check bit locations of the polar code:

{[49], [50], [52], [56]} check equation of the polar code:

[29, 39, 49], [30, 45, 50], [27, 47, 52], [31, 46, 51, 56].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=21, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [24], [25], [26], [28], [32], [33], [34], [35], [36], [37], [38], [40], [41], [42]} sequence numbers of check bit locations of the polar code:

{[44], [48], [49], [50], [52], [56]} check equation of the polar code:

[29, 39, 44], [23, 43, 48], [29, 39, 49], [30, 45, 50], [27, 47, 52], [31, 46, 51, 56].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=22, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [24], [25], [26], [28], [32], [33], [34], [35], [36], [37], [38], [40], [41], [42]} sequence numbers of check bit locations of the polar code:

{[48], [49], [52], [56], [60]} check equation of the polar code:

[23, 43, 48], [29, 39, 44, 49], [27, 47, 52], [31, 46, 51, 56], [30, 45, 50, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=12, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [43], [44], [48], [49], [50]} sequence numbers of check bit locations of the polar code:

{[52], [55], [56], [59], [61], [62]} check equation of the polar code:

[47, 52], [30, 45, 55], [31, 46, 51, 56], [54, 59], [31, 46, 51, 61], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=13, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [44], [48], [49], [50]} sequence numbers of check bit locations of the polar code:

{[52], [55], [56], [59], [61], [62]} check equation of the polar code:

[47, 52], [30, 45, 55], [31, 46, 51, 56], [54, 59], [31, 46, 51, 61], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=14, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [39], [40], [41], [42], [44], [48], [49], [50]} sequence numbers of check bit locations of the polar code:

{[52], [55], [56], [59], [61], [62]} check equation of the polar code:

[47, 52], [30, 45, 55], [31, 46, 51, 56], [29, 54, 59], [31, 46, 51, 61], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=15, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [39], [40], [41], [42], [44], [48], [49], [50]} sequence numbers of check bit locations of the polar code:

{[52], [56], [60], [61], [62]} check equation of the polar code:

[47, 52], [31, 46, 51, 56], [30, 45, 55, 60], [31, 46, 51, 61], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=16, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [40], [41], [42], [44], [48], [49]} sequence numbers of check bit locations of the polar code:

{[50], [52], [56], [57], [58], [60]} check equation of the polar code:

[30, 45, 50], [47, 52], [31, 46, 51, 56], [47, 57], [43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=17, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [44], [48]} sequence numbers of check bit locations of the polar code:

{[49], [50], [52], [56], [57], [58], [60]} check equation of the polar code:

[29, 39, 49], [30, 45, 50], [27, 47, 52], [31, 46, 51, 56], [27, 47, 57], [43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=18, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [44], [48]} sequence numbers of check bit locations of the polar code:

{[49], [50], [52], [56], [58], [60]} check equation of the polar code:

[29, 39, 49], [30, 45, 50], [27, 47, 52], [31, 46, 51, 56], [43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=19, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38]. [40], [41], [42], [44]} sequence numbers of check bit locations of the polar code:

{[48], [49], [50], [52], [56], [58], [60]} check equation of the polar code:

[23, 43, 48], [29, 39, 49], [30, 45, 50], [27, 47, 52], [31, 46, 51, 56], [23, 43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=20, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [4], [42], [44], [48]} sequence numbers of check bit locations of the polar code:

{[49], [50], [52], [56], [60]} check equation of the polar code:

[29, 39, 49], [30, 45, 50], [27, 47, 52], [31, 46, 51, 56], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=21, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [42], [44]} sequence numbers of check bit locations of the polar code:

{[48], [49], [50], [52], [56]} check equation of the polar code:

[23, 43, 48], [29, 39, 49], [30, 45, 50], [27, 47, 52], [31, 46, 51, 56].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=22, a polar code in the following form may be used:

sequence numbers of frozen bit locations of the polar code:

{[0], [1], [2], [3], [4], [5], [6], [7], [8], [9], [10], [11], [12], [13], [14], [16], [17], [18], [19], [20], [21], [22], [24], [25], [26], [28], [32], [33], [34], [35], [36], [37], [38], [40], [41]} sequence numbers of check bit locations of the polar code:

{[42], [44], [48], [49], [50], [52], [56]} check equation of the polar code:

[27, 42], [29, 39, 44], [23, 43, 48], [29, 39, 49], [15, 30, 45, 50], [27, 47, 52], [31, 46, 51, 56]

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

Embodiment 4

Embodiment 4 is roughly similar to Embodiment 3, except that in Embodiment 3, a quantity of second-type check bits is limited to 2, and in Embodiment 4, a quantity of second-type check bits is not limited, and only a total quantity of first-type check bits and second-type check bits is limited to 8. A structure of a polar code constructed in Embodiment 4 is as follows:

When M=48 and K=12, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [27], [28], [29], [32], [33], [34], [35], [36], [37], [38], [39], [40], [41], [42], [43], [44], [48], [49]} sequence numbers of check bit locations of the polar code:

{[50], [52], [56], [58], [60], [61], [62]} check equation of the polar code:

[30, 45, 50], [47, 52], [31, 46, 51, 56], [53, 58], [30, 45, 55, 60], [31, 46, 51, 61], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=13, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [27], [28], [29], [32], [33], [34], [35], [36], [37], [38], [39], [40], [41], [42], [44], [48], [49]} sequence numbers of check bit locations of the polar code:

{[50], [52], [56], [58], [60], [61], [62]} check equation of the polar code:

[30, 45, 50], [47, 52], [31, 46, 51, 56], [43, 53, 58], [30, 45, 55, 60], [31, 46, 51, 61], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=14, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [27], [28], [32], [33], [34], [35], [36], [37], [38], [39], [40], [41], [42], [44], [48]} sequence numbers of check bit locations of the polar code:

{[49], [50], [52], [54], [56], [57], [58], [60]} check equation of the polar code:

[29, 49], [30, 45, 50], [47, 52], [29, 54], [31, 46, 51, 56], [47, 57], [43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=15, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [27], [28], [32], [33], [34], [35], [36], [37], [38], [39], [40], [41], [42], [44]} sequence numbers of check bit locations of the polar code:

{[48], [49], [50], [52], [56], [58], [60], [62]} check equation of the polar code:

[43, 48], [29, 49], [30, 45, 50], [47, 52], [31, 46, 51, 56], [43, 53, 58], [30, 45, 55, 60], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=16, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [27], [28], [32], [33], [34], [35], [36], [37], [38], [39], [40], [41], [42], [44]} sequence numbers of check bit locations of the polar code:

{[48], [49], [50], [52], [56], [58], [60]} check equation of the polar code:

[43, 48], [29, 49], [30, 45, 50], [47, 52], [31, 46, 51, 56], [43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=17, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [27], [28], [32], [33], [34], [35], [36], [37], [38], [40], [41], [42]} sequence numbers of check bit locations of the polar code:

{[44], [48], [49], [50], [52], [56], [58], [60]} check equation of the polar code:

[29, 39, 44], [43, 48], [29, 39, 49], [30, 45, 50], [47, 52], [31, 46, 51, 56], [43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=18, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [28], [32], [33], [34], [35], [36], [37], [38], [40], [41], [42], [44], [48]} sequence numbers of check bit locations of the polar code:

{[49], [50], [52], [56], [58], [60]} check equation of the polar code:

[29, 39, 49], [30, 45, 50], [27, 47, 52], [31, 46, 51, 56], [43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=19, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [28], [32], [33], [34], [35], [36], [37], [38], [40], [41], [42], [44], [48]} sequence numbers of check bit locations of the polar code:

{[49], [50], [52], [56], [60]} check equation of the polar code:

[29, 39, 49], [30, 45, 50], [27, 47, 52], [31, 46, 51, 56], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=20, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14][15]} sequence numbers of frozen bit locations of the polar code:

{[16], [17], [18], [19], [20], [21], [22], [23], [24], [25], [26], [28], [32], [33], [34], [35], [36], [37], [38], [40], [41], [42]} sequence numbers of check bit locations of the polar code:

{[44], [48], [49], [50], [52], [56]} check equation of the polar code:

[29, 39, 44], [43, 48], [29, 39, 49], [30, 45, 50], [27, 47, 52], [31, 46, 51, 56].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=21, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [24], [25], [26], [28], [32], [33], [34], [35], [36], [37], [38], [40]} sequence numbers of check bit locations of the polar code:

{[41], [42], [44], [48], [49], [50], [52], [56]} check equation of the polar code:

[31, 41], [27, 42], [29, 39, 44], [23, 43, 48], [29, 39, 49], [30, 45, 50], [27, 47, 52], [31, 46, 51, 56].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=22, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [24], [25], [26], [28], [32], [33], [34], [35], [36], [37], [38]} sequence numbers of check bit locations of the polar code:

{[40], [41], [42], [48], [49], [52], [56], [60]} check equation of the polar code:

[30, 40], [31, 41], [27, 42], [23, 43, 48], [29, 39, 44, 49], [27, 47, 52], [31, 46, 51, 56], [30, 45, 50, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=12, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [43], [44], [48], [49]} sequence numbers of check bit locations of the polar code:

{[50], [52], [55], [56], [59], [61], [62]} check equation of the polar code:

[30, 45, 50], [47, 52], [30, 45, 55], [31, 46, 51, 56], [54, 59], [31, 46, 51, 61], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=13, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [44], [48], [49]} sequence numbers of check bit locations of the polar code:

{[50], [52], [55], [56], [59], [61], [62]} check equation of the polar code:

[30, 45, 50], [47, 52], [30, 45, 55], [31, 46, 51, 56], [54, 59], [31, 46, 51, 61], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=14, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [39], [40], [41], [42], [44], [48]} sequence numbers of check bit locations of the polar code:

{[49], [50], [52], [55], [56], [59], [61], [62]} check equation of the polar code:

[29, 49], [30, 45, 50], [47, 52], [30, 45, 55], [31, 46, 51, 56], [29, 54, 59], [31, 46, 51, 61], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=15, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [39], [40], [41], [42], [44]} sequence numbers of check bit locations of the polar code:

{[48], [49], [50], [52], [56], [60], [61], [62]} check equation of the polar code:

[43, 48], [29, 49], [30, 45, 50], [47, 52], [31, 46, 51, 56], [30, 45, 55, 60], [31, 46, 51, 61], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=16, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [40], [41], [42], [44], [48]} sequence numbers of check bit locations of the polar code:

{[49], [50], [52], [56], [57], [58], [60]} check equation of the polar code:

[29, 39, 49], [30, 45, 50], [47, 52], [31, 46, 51, 56], [47, 57], [43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=17, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [44], [48]} sequence numbers of check bit locations of the polar code:

{[49], [50], [52], [56], [57], [58], [60]} check equation of the polar code:

[29, 39, 49], [30, 45, 50], [27, 47, 52], [31, 46, 51, 56], [27, 47, 57], [43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=18, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [44]} sequence numbers of check bit locations of the polar code:

{[48], [49], [50], [52], [56], [58], [60]} check equation of the polar code:

[43, 48], [29, 39, 49], [30, 45, 50], [27, 47, 52], [31, 46, 51, 56], [43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=19, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [42]} sequence numbers of check bit locations of the polar code:

{[44], [48], [49], [50], [52], [56], [58], [60]} check equation of the polar code:

[29, 39, 44], [23, 43, 48], [29, 39, 49], [30, 45, 50], [27, 47, 52], [31, 46, 51, 56], [23, 43, 53, 581, 130, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=20, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41]} sequence numbers of check bit locations of the polar code:

{[42], [44], [48], [49], [50], [52], [56], [60]} check equation of the polar code:

[27, 42], [29, 39, 44], [23, 43, 48], [29, 39, 49], [30, 45, 50], [27, 47, 52], [31, 46, 51, 56], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=21, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40]} sequence numbers of check bit locations of the polar code:

{[41], [42], [44], [48], [49], [50], [52], [56]} check equation of the polar code:

[31, 41], [27, 42], [29, 39, 44], [23, 43, 48], [29, 39, 49], [30, 45, 50], [27, 47, 52], [31, 46, 51, 56],

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=21, a polar code in the following form may be used:

sequence numbers of frozen bit locations of the polar code:

{[0], [1], [2], [3], [4], [5], [6], [7], [8], [9], [10], [11], [12], [13], [14], [16], [17], [18], [19], [20], [21], [22], [24], [25], [26], [28], [32], [33], [34], [35], [36], [37], [38], [40]} sequence numbers of check bit locations of the polar code:

{[41], [42], [44], [48], [49], [50], [52], [56]} check equation of the polar code:

[31, 41], [27, 42], [29, 39, 44], [23, 43, 48], [29, 39, 49], [15, 30, 45, 50], [27, 47, 52], [31, 46, 51, 56].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

Embodiment 5

In Embodiment 1 to Embodiment 4, at least one of the following conditions is limited: a total quantity of first-type check bits and second-type check bits, a quantity of second-type check bits, a manner of selecting second-type check bits, and a specific form of a check equation. In Embodiment 5, the foregoing conditions are not limited, various combination manners of information bit locations and check bit locations are traversed, and a combination manner with better performance is verified through an experiment. A form of a polar code constructed in Embodiment 5 is as follows:

When M=48 and K=12, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [27], [28], [32], [33], [34], [36], [37], [38], [40], [42], [48]} sequence numbers of check bit locations of the polar code:

{[35], [39], [41], [44], [46], [49], [50], [52], [53], [54], [56], [57], [58], [60]} check equation of the polar code:

[30, 35], [29, 39], [31, 41], [29, 44], [30, 46], [29, 49], [30, 45, 50], [47, 52], [43, 53], [29, 54], [31, 51, 56], [47, 57], [43, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=13, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [24], [25], [26], [28], [30], [32], [33], [34], [35], [36], [37], [38], [40], [41], [42], [44], [48], [49], [50], [52], [56], [60]} sequence numbers of check bit locations of the polar code:

{[39], [43], [45], [46], [57], [58]} check equation of the polar code:

[23, 39], [29, 43], [29, 45], [27, 46], [54, 57], [23, 58].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=14, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [24], [25], [26], [28], [29], [32], [33], [34], [35], [36], [37], [38], [40], [41], [42], [44], [48], [49], [50], [52], [56]} sequence numbers of check bit locations of the polar code:

{[39], [43], [45], [46], [58], [60]} check equation of the polar code:

[23, 39], [30, 43], [23, 45], [23, 46], [53, 58], [27, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=15, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[61], [17], [18], [19], [20], [21], [22], [23], [24], [25], [26], [27], [28], [32], [33], [34], [35], [36], [37], [38], [40], [41], [42], [44], [48], [49], [50], [52]} sequence numbers of check bit locations of the polar code:

{[39], [56], [58], [60], [62]} check equation of the polar code:

[23, 39], [31, 46, 51, 56], [43, 53, 58], [30, 45, 55, 60], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=16, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [27], [28], [32], [33], [37], [38], [42]} sequence numbers of check bit locations of the polar code:

{[34], [35], [36], [39], [40], [41], [44], [48], [49], [50], [52], [56], [58], [60]} check equation of the polar code:

[29, 34], [30, 35], [31, 36], [29, 39], [30, 40], [31, 41], [29, 44], [43, 48], [29, 49], [30, 45, 50], [47, 52], [31, 46, 51, 56], [43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=17, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [28], [33], [38]} sequence numbers of check bit locations of the polar code:

{[32], [34], [35], [36], [37], [40], [41], [42], [44], [48], [49], [50], [52], [56], [57], [58], [60]} check equation of the polar code:

[27, 32], [29, 34], [30, 35], [31, 36], [27, 37], [30, 40], [31, 41], [27, 42], [29, 39, 44], [43, 48], [29, 39, 49], [30, 45, 50], [27, 47, 52], [31, 46, 51, 56], [27, 47, 57], [43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=18, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [28], [32], [33], [34], [35], [36], [37], [38], [40], [41], [42], [48]} sequence numbers of check bit locations of the polar code:

{[44], [49], [50], [52], [56], [58], [60]} check equation of the polar code:

[29, 39, 44], [29, 39, 49], [30, 45, 50], [27, 47, 52], [31, 46, 51, 56], [43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=19, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [28], [32], [33], [34], [35], [36], [37], [38], [40], [41], [48]} sequence numbers of check bit locations of the polar code:

{[42], [44], [49], [50], [52], [56], [60]} check equation of the polar code:

[27, 42], [29, 39, 44], [29, 39, 49], [30, 45, 50], [27, 47, 52], [31, 46, 51, 56], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=20, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [23], [24], [25], [26], [28], [33], [38]} sequence numbers of check bit locations of the polar code:

{[32], [34], [35], [36], [37], [40], [41], [42], [44], [48], [49], [50], [52], [56]} check equation of the polar code:

[27, 32], [29, 34], [30, 35], [31, 36], [27, 37], [30, 40], [31, 41], [27, 42], [29, 39, 44], [43, 48], [29, 39, 49], [30, 45, 50], [27, 47, 52], [31, 46, 51, 56].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=21, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [24], [25], [26]} sequence numbers of check bit locations of the polar code:

{[28], [32], [33], [34], [35], [36], [37], [38], [40], [41], [42], [44], [48], [49], [50], [52], [56]} check equation of the polar code:

[23, 28], [27, 32], [23, 33], [29, 34], [30, 35], [31, 36], [27, 37], [23, 38], [30, 40], [31, 41], [27, 42], [29, 39, 44], [23, 43, 48], [29, 39, 49], [30, 45, 50], [27, 47, 52], [31, 46, 51, 56].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=48 and K=22, a polar code in the following form may be used:

sequence numbers of bit locations of the polar code that correspond to a puncturing operation or a shortening operation:

{[0], [1], [2], [3], [4], [5], [6], [7], [8], [9], [10], [11], [12], [13], [14], [15]} sequence numbers of frozen bit locations of the polar code:

{[16], [17], [18], [19], [20], [21], [22], [24], [25], [26]} sequence numbers of check bit locations of the polar code:

{[28], [32], [33], [34], [35], [36], [37], [38], [40], [41], [44], [48], [49], [50], [52], [56]} check equation of the polar code:

[23, 28], [27, 32], [23, 33], [29, 34], [30, 35], [31, 36], [27, 37], [23, 38], [30, 40], [31, 41], [29, 39, 44], [23, 43, 48], [29, 39, 49], [30, 45, 50], [27, 42, 47, 52], [31, 46, 51, 56].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=12, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [36], [37], [38], [40], [42], [48]} sequence numbers of check bit locations of the polar code:

{[35], [39], [41], [44], [46], [49], [50], [52], [53], [54], [56], [57], [58], [60]} check equation of the polar code:

[30, 35], [29, 39], [31, 41], [29, 44], [31, 46], [29, 49], [30, 45, 50], [47, 52], [43, 53], [29, 54], [31, 51, 56], [47, 57], [43, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=13, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [36], [37], [38], [40], [42], [48]} sequence numbers of check bit locations of the polar code:

{[35], [39], [41], [44], [49], [50], [52], [53], [54], [56], [57], [58], [60]} check equation of the polar code:

[30, 35], [29, 39], [31, 41], [29, 44], [29, 49], [30, 45, 50], [47, 52], [43, 53], [29, 54], [31, 46, 51, 56], [47, 57], [43, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=14, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [40], [41], [42], [44], [48], [49], [50], [52]} sequence numbers of check bit locations of the polar code:

{[39], [55], [56], [59], [61], [62]} check equation of the polar code:

[29, 39], [30, 45, 55], [31, 46, 51, 56], [29, 54, 59], [31, 46, 51, 61], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=15, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [40], [41], [42], [44], [48], [49], [50], [52]} sequence numbers of check bit locations of the polar code:

{[39], [56], [60], [61], [62]} check equation of the polar code:

[29, 39], [31, 46, 51, 56], [30, 45, 55, 60], [31, 46, 51, 61], [47, 57, 62].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=16, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [36], [38], [40], [48]} sequence numbers of check bit locations of the polar code:

{[35], [37], [41], [42], [44], [49], [50], [52], [54], [56], [57], [58], [60]} check equation of the polar code:

[30, 35], [27, 37], [31, 41], [27, 42], [29, 39, 44], [29, 39, 49], [30, 45, 50], [27, 47, 52], [29, 39, 54], [31, 46, 51, 56], [27, 47, 57], [43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=17, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [36], [38], [40][48]} sequence numbers of check bit locations of the polar code:

{[35], [37], [41], [42], [44], [49], [50], [52], [56], [57], [58], [60]} check equation of the polar code:

[30, 35], [27, 37], [31, 41], [27, 42], [29, 39, 44], [29, 39, 49], [30, 45, 50], [27, 47, 52], [31, 46, 51, 56], [27, 47, 57], [43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=18, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [48], [49]} sequence numbers of check bit locations of the polar code:

{[44], [50], [52], [56], [58], [60]} check equation of the polar code:

[29, 39, 44], [30, 45, 50], [27, 47, 52], [31, 46, 51, 56], [43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=19, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [42], [48]} sequence numbers of check bit locations of the polar code:

{[44], [49], [50], [52], [56], [58], [60]} check equation of the polar code:

[29, 39, 44], [29, 39, 49], [30, 45, 50], [27, 47, 52], [31, 46, 51, 56], [23, 43, 53, 58], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=20, a polar code in the following form may be used:

sequence numbers of frozen bit locations of the polar code:

{[0], [1], [2], [3][4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [42], [48], [49]} sequence numbers of check bit locations of the polar code:

{[44], [50], [52], [56], [60]} check equation of the polar code:

[29, 39, 44], [30, 45, 50], [27, 47, 52], [31, 46, 51, 56], [30, 45, 55, 60].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=21, a polar code in the following form may be used:

sequence numbers of frozen bit locations of the polar code:

{[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [42], [48]} sequence numbers of check bit locations of the polar code:

{[44], [49], [50], [52], [56]} check equation of the polar code:

[29, 39, 44], [29, 39, 49], [30, 45, 50], [27, 47, 52], [31, 46, 51, 56].

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

When M=64 and K=22, a polar code in the following form may be used:

sequence numbers of frozen bit locations of the polar code:

{[0], [1], [2], [3], [4], [5], [6], [7], [8], [9], [10], [11], [12], [13], [14], [16], [17], [18], [19], [20], [21], [22], [24], [26], [32], [33], [34], [36], [40], [48]} sequence numbers of check bit locations of the polar code:

{[25], [28], [35], [37], [38], [41], [42], [44], [49], [50], [52], [56]} check equation of the polar code:

[15, 25], [23, 28], [15, 30, 35], [27, 37], [23, 38], [31, 41], [27, 42], [29, 39, 44], [29, 39, 49], [15, 30, 45, 50], [27, 47, 52], [31, 46, 51, 56],

Remaining bit locations other than the foregoing listed bit locations (the bit locations corresponding to the puncturing operation, the bit locations corresponding to check bits, and the bit locations corresponding to frozen bits) in 64 bit locations of the polar code are information bit locations.

It should be understood that in Embodiment 1 to Embodiment 5, bit locations are numbered from [0], but the embodiments of this application are not limited thereto, and bit locations may be numbered from [1].

It should be further understood that in Embodiment 1 to Embodiment 5, an example in which check bits are PC bits is used for description, but the embodiments of this application are not limited thereto, and check bits may be a combination of a CRC bit and a PC bit. For example, a total quantity of check bits may be limited to 6, and the 6 check bits may include 3 CRC bits and 3 PC bits. When bit locations of the check bits are being determined, bit locations of the 3 CRC bits may be first determined, and then the 3 PC bits are distributed at other bit locations; or bit locations of the 3 PC bits may be first determined, and then the CRC bits are distributed at other bit locations.

The following describes apparatus embodiments of this application. Because the foregoing method can be performed in the apparatus embodiments, for a part not described in detail, refer to the foregoing method embodiments.

Figure 5:
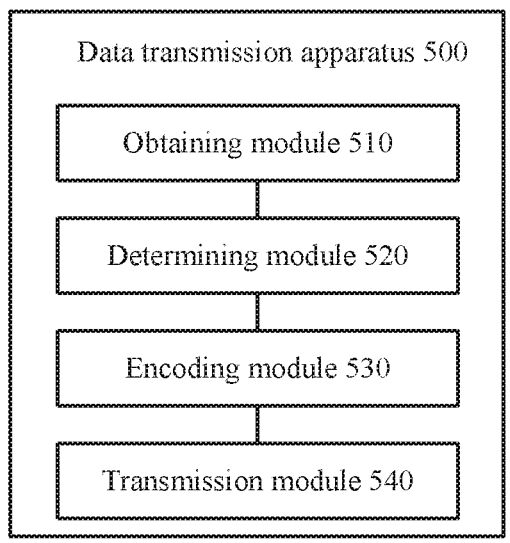
FIG. 5 is a schematic structural diagram of a data transmission apparatus according to an embodiment of this application.

FIG. 5 is a schematic structural diagram of a data transmission apparatus according to an embodiment of this application. The data transmission apparatus 500 in FIG. 5 can perform the foregoing steps performed by the transmit end in the foregoing description. The apparatus 500 may be, for example, a transmitter, and the transmitter may be a terminal device, or may be a base station (or referred to as an access network device). The apparatus 500 includes:

an obtaining module 510, configured to obtain K information bits, where K is a positive integer not less than 1;

a determining module 520, configured to determine to-be-encoded bits, where the to-be-encoded bits include (K+P) bits, the (K+P) bits include the K information bits and P check bits, the K information bits correspond to K polarization channels, the P check bits include T first-type check bits, all the T first-type check bits are parity check PC bits, reliability of a polarization channel corresponding to each of the T first-type check bits is greater than a minimum value of reliability of the K polarization channels, both P and T are nonnegative integers, and T≤P;

an encoding module 530, configured to perform polar coding on the to-be-encoded bits to obtain encoded bits, where the (K+P) bits are in a one-to-one correspondence with (K+P) rows in a generator matrix of the encoded bits, a minimum row weight of the (K+P) rows is $W_1$, a maximum row weight corresponding to the T first-type check bits is less than or equal to $W_2$, $W_2$ represents a minimum value other than $W_1$ in row weights of the (K+P) rows, and both $W_1$ and $W_2$ are positive integers not less than 1; and a transmission module 540, configured to transmit the encoded bits to a receive end.

Optionally, in some embodiments, the (K+P) rows include t1 first target rows, a row weight of each of the t1 first target rows is $W_1$, the t1 first target rows are in a one-to-one correspondence with t1 polarization channels, the T first-type check bits include f1 first-type check bits, the f1 first-type check bits correspond to f1 polarization channels with highest reliability in the t1 polarization channels, both t1 and f1 are positive integers not less than 1, t1<(K+P), and f1≤P.

Optionally, in some embodiments, the (K+P) rows include t2 second target rows, a row weight of each of the t2 second target rows is $W_2$, the t2 second target rows are in a one-to-one correspondence with t2 polarization channels, the T first-type check bits include f2 first-type check bits, the f2 first-type check bits correspond to f2 polarization channels with highest reliability in the t2 polarization channels, both t2 and f2 are positive integers not less than 1, t2<(K+P), and f2≤P.

Optionally, in some embodiments, the P check bits include f3 second-type check bits, all the f3 second-type check bits are PC bits, reliability of polarization channels corresponding to the f3 second-type check bits is less than the reliability of the K polarization channels, f3 is a positive integer not less than 1, and f3≤P.

Optionally, in some embodiments, the T first-type check bits correspond to T polarization channels, the polarization channels corresponding to the f3 second-type check bits are f3 polarization channels with highest reliability other than the K polarization channels and the T polarization channels in M polarization channels, the M polarization channels are remaining polarization channels other than polarization channels or a polarization channel corresponding to a puncturing operation and/or a shortening operation in polarization channels used for the polar coding, and M is a positive integer not less than 1.

Optionally, in some embodiments, the T first-type check bits correspond to T polarization channels, the polarization channels corresponding to the f3 second-type check bits are f3 polarization channels with highest polarization channel sequence numbers other than the K polarization channels and the T polarization channels in M polarization channels, the M polarization channels are remaining polarization channels other than polarization channels or a polarization channel corresponding to a puncturing operation and/or a shortening operation in polarization channels used for the polar coding, and M is a positive integer not less than 1.

Optionally, in some embodiments, a difference between a location sequence number of each PC bit in the P check bits in the to-be-encoded bits and a location sequence number of each information bit in the to-be-encoded bits that is checked by using each PC bit is an integer multiple of a preset prime number.

Optionally, in some embodiments, each PC bit included in the P check bits and each information bit checked by using each PC bit meet the following conditions: if $g_i=g_j$, a Hamming weight of $g_k$ is greater than a Hamming weight of each of $g_i$ and $g_j$; and if $g_i \neq g_j$, a Hamming weight of $g_k$ is greater than a minimum value of Hamming weights of $g_i$ and $g_j$, where $g_i$ represents a row vector that is in the generator matrix and that corresponds to each PC bit, $g_j$ represents a row vector that is in the generator matrix and that corresponds to each information bit, $g_k=\mathrm{mod}(g_i+g_j, 2)$, and mod(.) represents a modulo operation.

Optionally, in some embodiments, all the P check bits are PC bits, or the P check bits include a PC bit and a cyclic redundancy check CRC bit.

Figure 6:
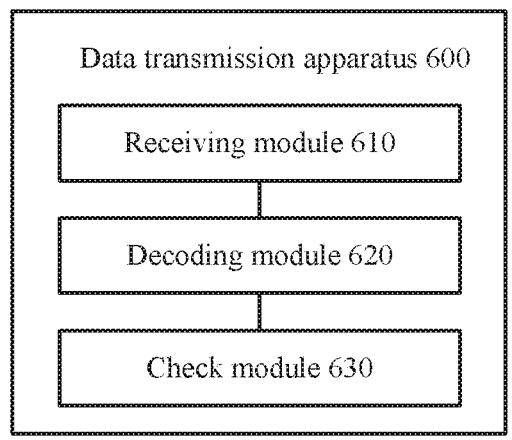
FIG. 6 is a schematic structural diagram of a data transmission apparatus according to another embodiment of this application.

FIG. 6 is a schematic structural diagram of a data transmission apparatus according to another embodiment of this application. The data transmission apparatus 600 in FIG. 6 can perform the foregoing steps performed by the receive end in the foregoing description. The apparatus 600 may be, for example, a receiver, and the receiver may be a terminal device, or may be a base station (or referred to as an access network device). The apparatus 600 includes:

a receiving module 610, configured to receive encoded bits transmitted by a transmit end;

a decoding module 620, configured to perform polar decoding on the encoded bits to obtain decoded bits, where the decoded bits include (K+P) bits, the (K+P) bits include K information bits and P check bits, the K information bits correspond to K polarization channels, the P check bits include T first-type check bits, all the T first-type check bits are parity check PC bits, reliability of a polarization channel corresponding to each of the T first-type check bits is greater than a minimum value of reliability of the K polarization channels, the (K+P) bits are in a one-to-one correspondence with (K+P) rows in a generator matrix of the encoded bits, a minimum row weight of the (K+P) rows is $W_1$, a maximum row weight corresponding to the T first-type check bits is less than or equal to $W_2$, $W_2$ represents a minimum value other than $W_1$ in row weights of the (K+P) rows, both $W_1$ and $W_2$ are positive integers not less than 1, both P and T are nonnegative integers. T≤P, and all of K, $W_1$, and $W_2$ are positive integers not less than 1; and a check module 630, configured to check at least some of the K information bits by using the P check bits.

Optionally, in some embodiments, the (K+P) rows include t1 first target rows, a row weight of each of the t1 first target rows is $W_1$, the t1 first target rows are in a one-to-one correspondence with t1 polarization channels, the T first-type check bits include f1 first-type check bits, the f1 first-type check bits correspond to f1 polarization channels with highest reliability in the t1 polarization channels, both t1 and f1 are positive integers not less than 1, t1<(K+P), and f1≤P.

Optionally, in some embodiments, the (K+P) rows include t2 second target rows, a row weight of each of the t2 second target rows is $W_2$, the t2 second target rows are in a one-to-one correspondence with t2 polarization channels, the T first-type check bits include f2 first-type check bits, the f2 first-type check bits correspond to f2 polarization channels with highest reliability in the t2 polarization channels, both t2 and f2 are positive integers not less than 1, t2<(K+P), and f2≤P.

Optionally, in some embodiments, the P check bits include f3 second-type check bits, all the f3 second-type check bits are PC bits, reliability of polarization channels corresponding to the f3 second-type check bits is less than the reliability of the K polarization channels, f3 is a positive integer not less than 1, and f3≤P.

Optionally, in some embodiments, the T first-type check bits correspond to T polarization channels, the polarization channels corresponding to the f3 second-type check bits are f3 polarization channels with highest reliability other than the K polarization channels and the T polarization channels in M polarization channels, the M polarization channels are remaining polarization channels other than polarization channels or a polarization channel corresponding to a puncturing operation and/or a shortening operation in polarization channels used for the polar decoding, and M is a positive integer not less than 1.

Optionally, in some embodiments, the T first-type check bits correspond to T polarization channels, the polarization channels corresponding to the f3 second-type check bits are l3 polarization channels with highest polarization channel sequence numbers other than the K polarization channels and the T polarization channels in M polarization channels, the M polarization channels are remaining polarization channels other than polarization channels or a polarization channel corresponding to a puncturing operation and/or a shortening operation in polarization channels used for the polar decoding, and M is a positive integer not less than 1.

Optionally, in some embodiments, a difference between a location sequence number of each PC bit in the P check bits in the decoded bits and a location sequence number of each information bit in the decoded bits that is checked by using each PC bit is an integer multiple of a preset prime number.

Optionally, in some embodiments, each PC bit in the P check bits and each information bit checked by using each PC bit meet the following conditions: if $g_i = g_j$, a Hamming weight of $g_k$ is greater than a Hamming weight of each of $g_i$ and $g_j$; and if $g_i \neq g_j$, a Hamming weight of $g_k$ is greater than a minimum value of Hamming weights of $g_i$ and $g_j$, where $g_i$ represents a row vector that is in the generator matrix and that corresponds to each PC bit, $g_j$ represents a row vector that is in the generator matrix and that corresponds to each information bit, $g_k = \text{mod}(g_i + g_j, 2)$, and mod(.) represents a modulo operation.

Optionally, in some embodiments, all the P check bits are PC bits, or the P check bits include a PC bit and a CRC bit.

Figure 7:
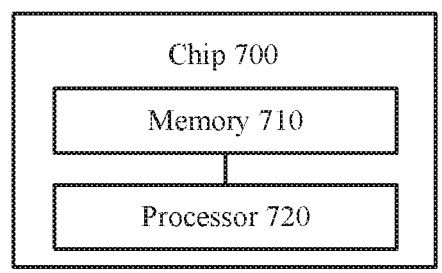
FIG. 7 is a schematic structural diagram of a chip according to an embodiment of this application.

FIG. 7 is a schematic structural diagram of a chip according to an embodiment of this application. An operation performed by the chip 700 in FIG. 7 corresponds to FIG. 2. Repeated descriptions are appropriately omitted for brevity. The chip 700 includes:

a memory 710, configured to store a program; and a processor 720 (the processor may be, for example, a baseband processor), configured to execute the program stored in the memory, to perform the following operations:

obtaining K information bits, where K is a positive integer not less than 1;

determining to-be-encoded bits, where the to-be-encoded bits include (K+P) bits, the (K+P) bits include the K information bits and P check bits, the K information bits correspond to K polarization channels, the P check bits include T first-type check bits, all the T first-type check bits are parity check PC bits, reliability of a polarization channel corresponding to each of the T first-type check bits is greater than a minimum value of reliability of the K polarization channels, both P and T are nonnegative integers, and T≤P; and performing polar coding on the to-be-encoded bits to obtain encoded bits, where the (K+P) bits are in a one-to-one correspondence with (K+P) rows in a generator matrix of the encoded bits, a minimum row weight of the (K+P) rows is $W_1$, a maximum row weight corresponding to the T first-type check bits is less than or equal to $W_2$, $W_2$ represents a minimum value other than $W_1$ in row weights of the (K+P) rows, and both $W_1$ and $W_2$ are positive integers not less than 1.

Optionally, in some embodiments, the (K+P) rows include t1 first target rows, a row weight of each of the t1 first target rows is $W_1$, the t1 first target rows are in a one-to-one correspondence with t1 polarization channels, the T first-type check bits include f1 first-type check bits, the f1 first-type check bits correspond to f1 polarization channels with highest reliability in the t1 polarization channels, both t1 and f1 are positive integers not less than 1, t1<(K+P), and f1≤P.

Optionally, in some embodiments, the (K+P) rows include t2 second target rows, a row weight of each of the t2 second target rows is $W_2$, the t2 second target rows are in a one-to-one correspondence with t2 polarization channels, the T first-type check bits include f2 first-type check bits, the f2 first-type check bits correspond to f2 polarization channels with highest reliability in the t2 polarization channels, both t2 and f2 are positive integers not less than 1, t2<(K+P), and f2≤P.

Optionally, in some embodiments, the P check bits include f3 second-type check bits, all the f3 second-type check bits are PC bits, reliability of polarization channels corresponding to the f3 second-type check bits is less than the reliability of the K polarization channels, f3 is a positive integer not less than 1, and f35≤P.

Optionally, in some embodiments, the T first-type check bits correspond to T polarization channels, the polarization channels corresponding to the f3 second-type check bits are f3 polarization channels with highest reliability other than the K polarization channels and the T polarization channels in M polarization channels, the M polarization channels are remaining polarization channels other than polarization channels or a polarization channel corresponding to a puncturing operation and/or a shortening operation in polarization channels used for the polar coding, and M is a positive integer not less than 1.

Optionally, in some embodiments, the T first-type check bits correspond to T polarization channels, the polarization channels corresponding to the f3 second-type check bits are f3 polarization channels with highest polarization channel sequence numbers other than the K polarization channels and the T polarization channels in M polarization channels, the M polarization channels are remaining polarization channels other than polarization channels or a polarization channel corresponding to a puncturing operation and/or a shortening operation in polarization channels used for the polar coding, and M is a positive integer not less than 1.

Optionally, in some embodiments, a difference between a location sequence number of each PC bit in the P check bits in the to-be-encoded bits and a location sequence number of each information bit in the to-be-encoded bits that is checked by using each PC bit is an integer multiple of a preset prime number.

Optionally, in some embodiments, each PC bit included in the P check bits and each information bit checked by using each PC bit meet the following conditions: if $g_i = g_j$, a Hamming weight of $g_k$ is greater than a Hamming weight of each of $g_i$ and $g_j$; and if $g_i \neq g_j$, a Hamming weight of $g_k$ is greater than a minimum value of Hamming weights of $g_i$ and $g_j$, where $g_i$ represents a row vector that is in the generator matrix and that corresponds to each PC bit, $g_j$ represents a row vector that is in the generator matrix and that corresponds to each information bit, $g_k = \mod(g_i + g_j, 2)$, and $\mod(.)$ represents a modulo operation.

Optionally, in some embodiments, all the P check bits are PC bits, or the P check bits include a PC bit and a CRC bit.

Figure 8:
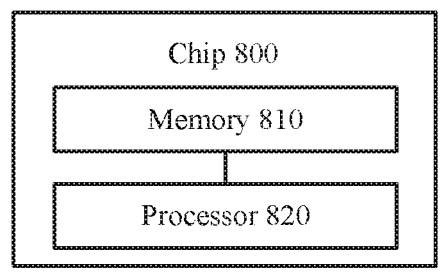
FIG. 8 is a schematic structural diagram of a chip according to an embodiment of this application.

FIG. 8 is a schematic structural diagram of a chip according to an embodiment of this application. An operation performed by the chip 800 in FIG. 8 corresponds to FIG. 4. Repeated descriptions are appropriately omitted for brevity. The chip 800 includes:

a memory 810, configured to store a program; and a processor 820 (the processor may be, for example, a baseband processor), configured to execute the program stored in the memory, to perform the following operations:

performing polar decoding on encoded bits received from a transmit end, to obtain decoded bits, where the decoded bits include (K+P) bits, the (K+P) bits include K information bits and P check bits, the K information bits correspond to K polarization channels, the P check bits include T first-type check bits, all the T first-type check bits are parity check PC bits, reliability of a polarization channel corresponding to each of the T first-type check bits is greater than a minimum value of reliability of the K polarization channels, the (K+P) bits are in a one-to-one correspondence with (K+P) rows in a generator matrix of the encoded bits, a minimum row weight of the (K+P) rows is $W_1$, a maximum row weight corresponding to the T first-type check bits is less than or equal to $W_2$, $W_2$ represents a minimum value other than $W_1$ in row weights of the (K+P) rows, both $W_1$ and $W_2$ are positive integers not less than 1, both P and T are nonnegative integers, T≤P and all of K, $W_1$, and $W_2$ are positive integers not less than 1; and checking at least some of the K information bits by using the P check bits.

Optionally, in some embodiments, the (K+P) rows include t1 first target rows, a row weight of each of the t1 first target rows is $W_1$, the t1 first target rows are in a one-to-one correspondence with t1 polarization channels, the T first-type check bits include f1 first-type check bits, the f1 first-type check bits correspond to f1 polarization channels with highest reliability in the t1 polarization channels, both t1 and f1 are positive integers not less than 1, t1<(K+P), and f1≤P.

Optionally, in some embodiments, the (K+P) rows include t2 second target rows, a row weight of each of the t2 second target rows is $W_2$, the t2 second target rows are in a one-to-one correspondence with t2 polarization channels, the T first-type check bits include f2 first-type check bits, the f2 first-type check bits correspond to f2 polarization channels with highest reliability in the t2 polarization channels, both t2 and f2 are positive integers not less than 1, t2<(K+P), and f2≤P.

Optionally, in some embodiments, the P check bits include f3 second-type check bits, all the f3 second-type check bits are PC bits, reliability of polarization channels corresponding to the f3 second-type check bits is less than the reliability of the K polarization channels, f3 is a positive integer not less than 1, and f3≤P.

Optionally, in some embodiments, the T first-type check bits correspond to T polarization channels, the polarization channels corresponding to the 3 second-type check bits are f3 polarization channels with highest reliability other than the K polarization channels and the T polarization channels in M polarization channels, the M polarization channels are remaining polarization channels other than polarization channels or a polarization channel corresponding to a puncturing operation and/or a shortening operation in polarization channels used for the polar decoding, and M is a positive integer not less than 1.

Optionally, in some embodiments, the T first-type check bits correspond to T polarization channels, the polarization channels corresponding to the f3 second-type check bits are f3 polarization channels with highest polarization channel sequence numbers other than the K polarization channels and the T polarization channels in M polarization channels, the M polarization channels are remaining polarization channels other than polarization channels or a polarization channel corresponding to a puncturing operation and/or a shortening operation in polarization channels used for the polar decoding, and M is a positive integer not less than 1.

Optionally, in some embodiments, a difference between a location sequence number of each PC bit in the P check bits in the decoded bits and a location sequence number of each information bit in the decoded bits that is checked by using each PC bit is an integer multiple of a preset prime number.

Optionally, in some embodiments, each PC bit in the P check bits and each information bit checked by using each PC bit meet the following conditions: if $g_i = g_j$, a Hamming weight of $g_k$ is greater than a Hamming weight of each of $g_i$ and $g_j$; and if $g_i \neq g_j$, a Hamming weight of $g_k$ is greater than a minimum value of Hamming weights of $g_i$ and $g_j$, where $g_i$ represents a row vector that is in the generator matrix and that corresponds to each PC bit, $g_j$ represents a row vector that is in the generator matrix and that corresponds to each information bit, $g_k = \mod(g_i + g_j, 2)$, and $\mod(.)$ represents a modulo operation.

Optionally, in some embodiments, all the P check bits are PC bits, or the P check bits include a PC bit and a cyclic redundancy check CRC bit.

Figure 9:
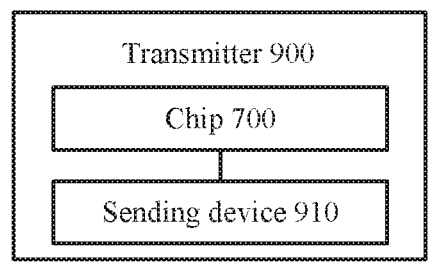
FIG. 9 is a schematic structural diagram of a transmitter according to an embodiment of this application.

FIG. 9 is a schematic structural diagram of a transmitter according to an embodiment of this application. The transmitter 900 in FIG. 9 may be, for example, a terminal device, or may be a base station (or referred to as an access network device). The transmitter 900 may include the chip 700. The transmitter 900 may further include a sending device 910, configured to transmit encoded bits to a receive end.

Figure 10:
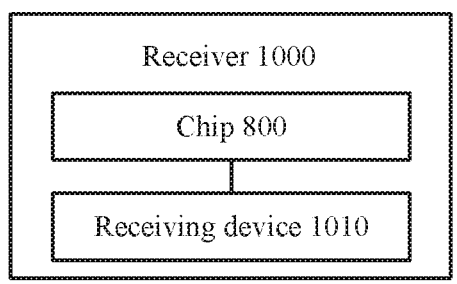
FIG. 10 is a schematic structural diagram of a receiver according to an embodiment of this application.

FIG. 10 is a schematic structural diagram of a receiver according to an embodiment of this application. The receiver 1000 in FIG. 10 may be, for example, a terminal device, or may be a base station (or referred to as an access network device). The receiver 1000 may include the chip 800. The receiver 1000 may further include a receiving device 1010, configured to transmit encoded bits to a receive end.

All or some of the foregoing embodiments may be implemented by using software, hardware, firmware, or any combination thereof. When software is used to implement the embodiments, all or some of the embodiments may be implemented in a form of a computer program product. The computer program product includes one or more computer instructions. When the computer program instructions are loaded and executed on a computer, all or some of the procedures or functions according to the embodiments of this application are generated. The computer may be a general-purpose computer, a dedicated computer, a computer network, or another programmable apparatus. The computer instructions may be stored in a computer readable storage medium or may be transmitted from a computer readable storage medium to another computer readable storage medium. For example, the computer instructions may be transmitted from a website, computer, server, or data center to another website, computer, server, or data center in a wired (for example, a coaxial cable, an optical fiber, or a digital subscriber line (digital subscriber line, DSL)) or wireless (for example, infrared, radio, or microwave) manner. The computer readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a digital video disc (digital video disc, DVD)), a semiconductor medium (for example, a solid state disk (solid state disk, SSD)), or the like.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraints of the technical solutions. A person skilled in the art may use different methods to implement the described functions for each particular application, but it should not be considered that the implementation goes beyond the scope of this application.

In the several embodiments provided in this application, it should be understood that the disclosed system, apparatus, and method may be implemented in other manners. For example, the described apparatus embodiment is merely an example. For example, the unit division is merely logical function division and there may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, and may be located in one position, or may be distributed on a plurality of network units. Some or all of the units may be selected based on actual requirements to achieve the objectives of the solutions of the embodiments.

In addition, functional units in the embodiments of this application may be integrated into one processing unit, or each of the units may exist alone physically, or two or more units may be integrated into one unit.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An encoding method, comprising:
obtaining K information bits, wherein K is a positive integer not less than 1;
determining to-be-encoded bits, wherein the to-be-encoded bits comprise (K+P) bits, wherein the (K+P) bits comprise the K information bits and P check bits, wherein the K information bits correspond to K polarization channels, wherein the P check bits comprise $f_3$ second-type check bits, wherein the $f_3$ second-type check bits are parity check (PC) bits, wherein reliability of polarization channels corresponding to the $f_3$ second-type check bits is less than reliability of the K polarization channels, wherein $f_3$ is a positive integer not less than 1, and wherein $f_3 \leq P$; and
performing polar coding on the to-be-encoded bits to obtain encoded bits.

2. The method according to claim 1, wherein the P check bits comprise T first-type check bits, wherein all the T first-type check bits are parity check PC bits, wherein the (K+P) bits are in a one-to-one correspondence with (K+P) rows in a generator matrix of the encoded bits, wherein a minimum row weight of the (K+P) rows is $W_1$, wherein a maximum row weight corresponding to the T first-type check bits is less than or equal to $W_2$, wherein $W_2$ represents a minimum value other than $W_1$ in row weights of the (K+P) rows, and wherein both $W_1$ and $W_2$ are positive integers not less than 1.

3. The method according to claim 1, wherein the P check bits comprise T first-type check bits, the T first-type check bits correspond to T polarization channels, wherein the polarization channels corresponding to the $f_3$ second-type check bits are $f_3$ polarization channels with highest reliability other than the K polarization channels and the T polarization channels in M polarization channels, wherein the M polarization channels are remaining polarization channels other than polarization channels or a polarization channel corresponding to at least one of a puncturing operation or a shortening operation in polarization channels used for the polar coding, and wherein M is a positive integer not less than 1.

4. The method according to claim 1, wherein:
when M=48 and K=14, M is a quantity of remaining polarization channels in N polarization channels after puncturing or shortening, and M is less than N; and
location sequence numbers of the P check bits comprise at least [52] and [56].

5. The method according to claim 4, wherein a difference between a location sequence number of each parity check (PC) bit in the P check bits in the to-be-encoded bits and a location sequence number of each information bit in the to-be-encoded bits that is checked by using each PC bit is an integer multiple of a preset prime number.

6. The method according to claim 1, wherein all the P check bits are PC bits, or the P check bits comprise at least one PC bit and at least one cyclic redundancy check (CRC) bit.

7. A communications apparatus, comprising:
at least one processor; and
one or more memories coupled to the at least one processor and storing programming instructions for execution by the at least one processor to perform operations comprising:
obtaining K information bits, wherein K is a positive integer not less than 1;
determining to-be-encoded bits, wherein the to-be-encoded bits comprise (K+P) bits, wherein the (K+P) bits comprise the K information bits and P check bits, wherein the K information bits correspond to K polarization channels, wherein the P check bits comprise $f_3$ second-type check bits, wherein the $f_3$ second-type check bits are parity check (PC) bits, wherein reliability of polarization channels corresponding to the $f_3$ second-type check bits is less than reliability of the K polarization channels, wherein $f_3$ is a positive integer not less than 1, and wherein $f_3 \leq P$; and
performing polar coding on the to-be-encoded bits to obtain encoded bits.

8. The apparatus according to claim 7, wherein the P check bits comprise T first-type check bits, wherein all the T first-type check bits are parity check PC bits, wherein the (K+P) bits are in a one-to-one correspondence with (K+P) rows in a generator matrix of the encoded bits, wherein a minimum row weight of the (K+P) rows is $W_1$, wherein a maximum row weight corresponding to the T first-type check bits is less than or equal to $W_2$, wherein $W_2$ represents a minimum value other than $W_1$ in row weights of the (K+P) rows, and wherein both $W_1$ and $W_2$ are positive integers not less than 1.

9. The apparatus according to claim 7, wherein the P check bits comprise T first-type check bits, the T first-type check bits correspond to T polarization channels, wherein the polarization channels corresponding to the $f_3$ second-type check bits are $f_3$ polarization channels with highest polarization channel sequence numbers other than the K polarization channels and the T polarization channels in M polarization channels, wherein the M polarization channels are remaining polarization channels other than polarization channels or a polarization channel corresponding to at least one of a puncturing operation or a shortening operation in polarization channels used for the polar coding, and wherein M is a positive integer not less than 1.

10. The apparatus according to claim 7, wherein:
when M=48 and K=14, M is a quantity of remaining polarization channels in N polarization channels after puncturing or shortening, and M is less than N; and
location sequence numbers of the P check bits comprise at least [52] and [56].

11. The apparatus according to claim 7, wherein all the P check bits are PC bits, or the P check bits comprise at least one PC bit and at least one cyclic redundancy check (CRC) bit.

12. A decoding method, comprising:
receiving encoded bits transmitted by a transmit end;
performing polar decoding on the encoded bits to obtain decoded bits, wherein the decoded bits comprise (K+P) bits, wherein the (K+P) bits comprise the K information bits and P check bits, wherein the K information bits correspond to K polarization channels, wherein the P check bits comprise $f_3$ second-type check bits, wherein the $f_3$ second-type check bits are parity check (PC) bits, wherein reliability of polarization channels corresponding to the $f_3$ second-type check bits is less than reliability of the K polarization channels, wherein B is a positive integer not less than 1, and $f_3 \leq P$; and
checking the K information bits by using the P check bits.

13. The method according to claim 12, wherein the P check bits comprise T first-type check bits corresponding to T polarization channels, wherein the polarization channels corresponding to the $f_3$ second-type check bits are $f_3$ polarization channels with highest reliability other than the K polarization channels and the T polarization channels in M polarization channels, wherein the M polarization channels are remaining polarization channels other than polarization channels or a polarization channel corresponding to at least one of a puncturing operation or a shortening operation in polarization channels used for the polar coding, and wherein M is a positive integer not less than 1.

14. The method according to claim 12, wherein:
when M=48 and K=14, M is a quantity of remaining polarization channels in N polarization channels after puncturing or shortening, and M is less than N; and
location sequence numbers of the P check bits comprise at least [52] and [56].

15. The method according to claim 12, wherein all the P check bits are PC bits, or the P check bits comprise at least one PC bit and at least one cyclic redundancy check (CRC) bit.

16. A communications apparatus, comprising:
at least one processor; and
one or more memories coupled to the at least one processor and storing programming instructions for execution by the at least one processor to perform operations comprising:
receiving encoded bits transmitted by a transmit end;
performing polar decoding on the encoded bits to obtain decoded bits, wherein the decoded bits comprise (K+P) bits, wherein the (K+P) bits comprise the K information bits and P check bits, wherein the K information bits correspond to K polarization channels, wherein the P check bits comprise $f_3$ second-type check bits, wherein the $f_3$ second-type check bits are parity check (PC) bits, wherein reliability of polarization channels corresponding to the $f_3$ second-type check bits is less than reliability of the K polarization channels, wherein B is a positive integer not less than 1, and wherein $f_3 \leq P$; and
checking the K information bits by using the P check bits.

17. The apparatus according to claim 16, wherein the P check bits comprise T first-type check bits, wherein all the T first-type check bits are parity check PC bits, wherein the (K+P) bits are in a one-to-one correspondence with (K+P) rows in a generator matrix of the encoded bits, wherein a minimum row weight of the (K+P) rows is $W_1$, wherein a maximum row weight corresponding to the T first-type check bits is less than or equal to $W_2$, wherein $W_2$ represents a minimum value other than $W_1$ in row weights of the (K+P) rows, and wherein both $W_1$ and $W_2$ are positive integers not less than 1.

18. The apparatus according to claim 16, wherein the P check bits comprise T first-type check bits corresponding to T polarization channels, wherein the polarization channels corresponding to the $f_3$ second-type check bits are $f_3$ polarization channels with highest reliability other than the K polarization channels and the T polarization channels in M polarization channels, wherein the M polarization channels are remaining polarization channels other than polarization channels or a polarization channel corresponding to at least one of a puncturing operation or a shortening operation in polarization channels used for the polar coding, and wherein M is a positive integer not less than 1.

19. The apparatus according to claim 16, wherein: when M=48 and K=14, M is a quantity of remaining polarization channels in N polarization channels after puncturing or shortening, and M is less than N; and location sequence numbers of the P check bits comprise at least [52] and [56].

20. The apparatus according to claim 16, wherein all the P check bits are PC bits, or the P check bits comprise at least one PC bit and at least one cyclic redundancy check (CRC) bit.

* * * * *